(12) United States Patent
Nuqui et al.

(10) Patent No.: US 9,618,586 B2
(45) Date of Patent: Apr. 11, 2017

(54) METHOD AND DEVICE FOR DETECTION OF A FAULT IN A PROTECTED UNIT

(71) Applicant: ABB Schweiz AG, Baden (CH)

(72) Inventors: Reynaldo Nuqui, Cary, NC (US); Jiuping Pan, Raleigh, NC (US); Jianping Wang, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/655,298

(22) PCT Filed: Feb. 12, 2013

(86) PCT No.: PCT/EP2013/052760
§ 371 (c)(1),
(2) Date: Jun. 24, 2015

(87) PCT Pub. No.: WO2014/124660
PCT Pub. Date: Aug. 21, 2014

(65) Prior Publication Data
US 2015/0338472 A1    Nov. 26, 2015

(51) Int. Cl.
*H02H 3/06*   (2006.01)
*G01R 31/40*   (2014.01)
(Continued)

(52) U.S. Cl.
CPC ........... *G01R 31/40* (2013.01); *G01R 31/025* (2013.01); *H02H 3/087* (2013.01); *H02H 7/268* (2013.01)

(58) Field of Classification Search
CPC .... G01R 31/40; G01R 31/021; G01R 31/025; G01R 31/343; G01R 31/42; G01R 31/34;
(Continued)

(56) References Cited

U.S. PATENT DOCUMENTS 3,609,459 A    9/1971   Thompson
7,030,623 B1 *  4/2006  Carpenter ............ G01R 31/025
                                                     324/522
(Continued)

FOREIGN PATENT DOCUMENTS

EP    1453174 A1    9/2004
EP    1580859 A2    9/2005
(Continued)

OTHER PUBLICATIONS

Naidoo D et al: "HVDC line protection for the proposed future HVDC systems", Power System Technology, 2004. Powercon 2004. 2004 International Confe Rence on Singapore Nov. 21-24, 2004, Piscataway, NJ, USA,IEEE, US, vol. 2, Nov. 21, 2004 {Nov. 21, 2004 ), p. 1327.*

(Continued)

*Primary Examiner* — Alesa Allgood
(74) *Attorney, Agent, or Firm* — Whitmyer IP Group LLC

(57) ABSTRACT

A method to facilitate fault detection in the protected unit after connection to the at least a portion of the power system. A current is sensed in the protected unit during a plurality of different time periods. Compliance of at least one of the sensed currents with a respective first current criteria is determined based on a first current threshold value. On a condition that there is determined that at least one of the sensed currents comply with the respective first current criteria, a fault in the protected unit is detected.

20 Claims, 13 Drawing Sheets

(51) Int. Cl.
*G01R 31/02* (2006.01)
*H02H 3/087* (2006.01)
*H02H 7/26* (2006.01)

(58) Field of Classification Search
CPC ...... G01R 31/026; G01R 31/08; G01R 31/12; G01R 31/1272; G01R 19/165; G01R 19/16538; G01R 15/18; G01R 21/00; B60Q 1/0076; B60Q 11/00; H05B 37/032; H05B 33/0815; H02H 3/08; H02H 7/0852; H02H 7/30; H02H 5/041; H02H 7/0833; H02H 1/0015; H02H 3/023; H02H 3/025; H02H 1/04; F25D 29/006
USPC ....... 324/500, 512, 521, 522, 523, 527, 528, 324/531–536, 764.01, 765.01, 539, 543, 324/555
See application file for complete search history.

(56) References Cited

U.S. PATENT DOCUMENTS

| | | | | |
|---|---|---|---|---|
| 7,120,563 | B2* | 10/2006 | Bechhoefer | G01R 31/11 324/533 |
| 8,339,142 | B2* | 12/2012 | Oowada | G01R 35/00 318/759 |
| 9,013,296 | B2* | 4/2015 | Clarke | G01R 19/155 324/523 |

FOREIGN PATENT DOCUMENTS

| | | |
|---|---|---|
| GB | 2487612 A | 8/2012 |
| JP | 3045116 A | 2/1991 |
| SU | 995182 A1 | 2/1983 |
| WO | 2011157305 A1 | 12/2011 |
| WO | 2011157306 A1 | 12/2011 |

OTHER PUBLICATIONS

Naidoo D et al: "HVDC line protection for the proposed future HVDC systems", Power System Technology, 2004. Powercon 2004. 2004 International Confe Rence on Singapore Nov. 21-24, 2004, Piscataway, NJ, USA,IEEE, US, vol. 2, Nov. 21, 2004 (Nov. 21, 2004 ), p. 1327.
International Preliminary Report of Patentability Application No. PCT/EP2013/052760 Issued: Feb. 2, 2015 6 pages.
International Search Report Application No. PCT/EP2013/052760 Completed: May 29, 2013; Mailing Date: Jun. 10, 2013 5 pages.
Written Opinion of the International Searching Authority Application No. PCT/EP2013/052760 Completed: May 29, 2013 6 pages.

* cited by examiner

US 9,618,586 B2

METHOD AND DEVICE FOR DETECTION OF A FAULT IN A PROTECTED UNIT

FIELD OF THE INVENTION

The present invention generally relates to power systems, e.g. power transmission systems. Specifically, the present invention relates to fault detection in a protected unit included in a power system, which protected unit for example may comprise a power transmission line, such as a direct current (DC) power transmission line, which may be a DC overhead line (OHL).

BACKGROUND OF THE INVENTION

In overhead transmission lines or overhead lines (OHL) auto-reclosing protection may be utilized. A fault protection or detection unit may be employed for monitoring one or several transmission lines of a power transmission network. In the event of a fault on a transmission line, the fault protection unit trips circuit breakers located at each end of the transmission line, for the purpose of disconnecting the transmission line having a fault from the rest of the power transmission network. Thereby, the risk of propagation of the fault in the power transmission network may be mitigated. Subsequently, depending on the type of fault, the circuit breakers may be closed in order to restore power transmission via the transmission line that was previously disconnected from the rest of the power transmission network. This may be referred to as auto-reclosing.

In OHLs most of the faults are typically temporary or transient faults, e.g., due to lightning strokes, and an auto-reclosing protection scheme may therefore be applied. On the other hand, in transmission lines based solely on cables, virtually all faults are permanent faults, and auto-reclosing is therefore not applied. Permanent faults may occur also in OHLs. In case of a permanent fault, the fault typically has to be cleared or removed by maintenance personnel.

Considering as an example a multi-terminal voltage source converter (VSC) based High Voltage Direct Current (HVDC) power system, faults on a DC cable or DC OHL are typically isolated from the rest of the power system or another part of the power system by temporarily shutting down the DC line, or temporarily taking the DC line out of operation, using DC circuit breakers.

For an OHL, the DC line is put back into operation after some time has passed to allow for the fault to be cleared, i.e. to allow for the fault arc current to be extinguished, in case it is a temporary fault. However, if the fault is a permanent fault, the DC line will be shut down again after reclosing it. In that case, the DC line will be shut down for a relatively long period to allow for maintenance personnel to locate and clear the fault. Events leading to DC line faults could happen both during normal operation when the DC line is energized, or when the DC line is not energized. In case the DC line is not energized when the fault occurs, the fault may only manifest itself when the DC line is attempted to be brought back into service or operation.

For faults in DC OHLs, DC circuit breakers are typically designed to auto-reclose after some time period, with the length of time period being based on the time it takes for the fault arc current to be extinguished. In case of temporary faults, the DC circuit breakers will first be tripped, and the DC line will then be restored back to normal operation following successful auto reclosing. In case of permanent faults however, the DC circuit breakers need to be tripped again after auto reclosing since there may still be a fault present in the DC line. It would therefore desirable for a DC line protection system or mechanism to be able to detect if the fault is still present after auto reclosing has been carried out. It would also be desirable that such detection could be carried out relatively quickly, with a speed comparable to a primary protection system, due to the high rate of rise in currents occurring in e.g. VSC based HVDC power transmission systems, or grids. Similarly, it would also be desirable to be able to detect if a fault in a DC line is present after having switched DC circuit breakers in order to energize an open DC line. In energizing an open DC line, a protection mechanism should be in place to ensure that a fault is detected if there is a fault present in the DC line.

SUMMARY OF THE INVENTION

In view of the above discussion, a concern of the present invention is to facilitate or even enable detection of faults, e.g. permanent faults, occurring or being present in a protected unit e.g. constituted by or including a DC line, subsequent to having carried out an auto reclosing operation or a switching operation for putting the protected unit, e.g. the DC line, back into operation.

A further concern of the present invention is to provide a scheme for detecting faults, e.g. permanent faults, occurring or being present in a protected unit e.g. constituted by or including a DC line, subsequent to having carried out an auto reclosing operation or a switching operation for putting the protected unit, e.g. the DC line, back into operation, by which scheme the speed of the detection of faults is relatively high and/or comparable to or even higher than a speed of a primary protection system for detecting faults in such a protected unit.

To address at least one of these concerns and other concerns, a method, a fault detection device, a power system and a computer program product in accordance with the independent claims are provided. Preferred embodiments are defined by the dependent claims.

It is to be understood that for the purpose of illustrating principles of embodiments of the present invention, embodiments of the present invention are described in the following generally with reference to a portion of a power system including a protected unit, which protected unit hence may be part of a power system. The protected unit may for example comprise a DC transmission line, such as a High Voltage Direct Current (HVDC) transmission line, or several DC or HVDC transmission lines, e.g. arranged in a DC grid. The power system may for example comprise a HVDC power transmission system.

According to a first aspect of the present invention, there is provided a method for use in fault detection in a protected unit included in a power system, which protected unit is adapted to convey power via at least one current path therein. The protected unit may for example comprise a power transmission line, such as a DC power transmission line. The power transmission line may for example comprise an overhead line. The protected unit can be selectively disconnected, or isolated, from at least a portion of the rest of the power system and the protected unit can be selectively connected to at least a portion of the rest of the power system, e.g. after the protected unit has been disconnected or isolated from at least a portion of the rest of the power system. The method may allow or even enable facilitating detection of any fault in the protected unit, e.g. a permanent fault in the protected unit, after the protected unit has been connected to at least a portion of the rest of the power system, e.g. after the protected unit has been disconnected or isolated from the at least a portion of the rest of the power system. The method comprises sensing a current in at least one current path in the protected unit, e.g. at one end of the protected unit, during a plurality of different time periods, thereby obtaining a plurality of sensed currents. Compliance of at least one of the sensed currents with a respective first current criteria based on a first current threshold value is determined. On a condition that there is determined that at least one of the sensed currents comply with the respective first current criteria, a signal indicating that there is a fault, e.g. a permanent fault, in the protected unit is generated. On a condition that there is determined that none of the sensed currents comply with the respective first current criteria, a signal indicating that there is not a fault, e.g. a permanent fault, in the protected unit is generated.

The generated signal or signals, and possibly any other generated signals as will be described in the following, can for example be utilized in determining whether to disconnect or isolate the protected unit from at least a portion of the rest of the power system, e.g. by tripping or opening a circuit breaker or circuit breakers. This will be further described in the following.

Sensing a current in the at least one current path in the protected unit, e.g. at one end of the protected unit, during a plurality of different time periods, thereby obtaining a plurality of sensed currents, and determining compliance of at least one of the sensed currents with a respective first current criteria based on a first current threshold value, may facilitate or enable detection of whether a fault, e.g. a permanent fault, in the at least one current path or protected unit, e.g. at one end of the protected unit, is present or exists at a certain point in time. The point in time can be immediately after the protected unit has been reconnected to at least a portion of the rest of the power system, or relatively close in time to after the protected unit has been reconnected to at least a portion of the rest of the power system, e.g. immediately following auto reclosing of the circuit breakers or relatively close in time to after auto reclosing of the circuit breakers, or following energization of the at least one current path in the protected unit.

By means of sensing a plurality of currents during a plurality of different time periods such detection may be carried out relatively quickly, e.g. with a speed comparable to or even higher than a speed of a primary protection system for detecting faults in such a protected unit.

Embodiments of the present invention may allow utilizing circuit breaker auto reclosing on protected units such as DC OHLs in power systems. By utilizing circuit breaker auto reclosing on DC OHLs it may not be necessary to shut down the DC line or DC link whenever a fault occurs in the power system, e.g. a DC grid. Auto reclosing circuit breakers on a DC line may reduce or even minimize the outage time of the DC line, which may improve the overall operation of the entire power system at least with respect to reducing or minimizing time when not in operation. As will become further evident from the following description, the generated signal or signals may be utilized in determining whether to disconnect the protected unit from at least a portion of the rest of the power system.

In the foregoing and in the following description, including the description referring to the drawings, sensing of current and possibly voltage in at least one current path in the protected unit for use in fault detection in the protected unit is mainly described with reference to an example where current and possibly voltage are sensed at one end of the protected unit. It is to be understood that this is merely for illustrating principles of the embodiments of the present invention and should not be considered as limiting. Rather, it is to be understood that such sensing of current and possibly voltage can be implemented at more than one end of the protected unit, e.g. at both ends of the protected unit in case it includes or is constituted by a transmission line, so as to facilitate or even enable fault detection in the protected unit at more than one end of the protected unit. This will be further described in the following.

In the context of the present application, by a plurality of different time periods it is meant at least two different time periods.

It is to be understood that in the context of the present application the term "time period", particularly when referring to sensing a current and/or a voltage, encompasses both the case of an instant or moment in time and the case of a time period having a certain duration, e.g during which time period a current or voltage is sensed.

The protected unit may for example comprise a DC transmission line, such as a HVDC transmission line, or several DC or HVDC transmission lines e.g. arranged in a grid, which may be referred to as a DC grid. The power system may comprise a HVDC power transmission system. HVDC transmission lines may be arranged in configurations such as monopole, symmetric monopole, or bipolar configurations. For example, a bipolar HVDC transmission line comprises a positive pole line, a negative pole line, and a metallic return line connected to ground. Faults that may occur on a bipolar HVDC transmission line include positive pole to negative pole short circuits, positive pole to ground short circuits, and negative pole to ground short circuits. Embodiments of the present invention may for example be implemented in the positive pole line and/or the negative pole line of a bipolar HVDC transmission line, or in other transmission line configurations that can be envisaged by the person skilled in the art. In other words, the protected unit may be included in the positive pole line and/or the negative pole line of a bipolar HVDC transmission line, or in another transmission line configuration.

An absolute value of at least one of the sensed currents, e.g. sensed in the at least one current path at one end of the protected unit, may be determined. Compliance of the absolute value with a second current criteria based on a second current threshold value may be determined. On a condition that there is determined that the absolute value complies with the second current criteria, a signal indicating that there is a fault, e.g. a permanent fault, in the protected unit may be generated. On a condition that there is determined that the absolute value complies with the second current criteria, a signal indicating that there is not a fault, e.g. a permanent fault, in the protected unit may be generated.

Such signalling based on determination of an absolute value of at least one of the sensed currents, e.g. sensed in the at least one current path at one end of the protected unit, may according to one embodiment of the present invention provide a back-up protection functionality to the signalling based on sensing current in the at least one current path in the protected unit, e.g. at one end of the protected unit, during a plurality of different time periods, whereby a plurality of sensed currents are obtained, in case the latter signalling fails to detect a fault in the protected unit even though there is a fault in the protected unit. The second current criteria may for example be whether the determined absolute value exceeds the second current threshold value, where in case the determined absolute value exceeds the second current threshold value, a signal indicating that there is a fault in the protected unit is generated.

A voltage of at least one current path in the protected unit, e.g. at one end of the protected unit, may be sensed. For example, a voltage between the at least one current path in the protected unit at one end of the protected unit and ground may be sensed. Compliance of the sensed voltage with a voltage criteria based on a voltage threshold value may be determined. On a condition that there is determined that the sensed voltage complies with the voltage criteria, a signal indicating that there is a fault, e.g. a permanent fault, in the protected unit may be generated. On a condition that there is determined that the sensed voltage complies with the voltage criteria, a signal indicating that there is not a fault, e.g. a permanent fault, in the protected unit may be generated.

When a protected unit such as a DC line is restored back to normal operation following successful auto reclosing, and there is no fault in the DC line, the line side voltage will initially 'jump' to the rated DC line voltage, and then oscillate about the rated DC line voltage, due to the nature of an RLC circuit, as known to a person skilled in the art. Eventually the line side voltage will be at or substantially at the rated DC line voltage after steady state conditions have been reached. The sensing of the voltage, determination of the sensed voltage with the voltage criteria and generation of a signal as described above may be referred to as an overvoltage blocking functionality. Implementing such functionality may facilitate or even enable using relatively sensitive settings for the signalling based on sensing current in the at least one current path in the protected unit during a plurality of different time periods, whereby a plurality of sensed currents are obtained, e.g. facilitating or even enabling use of a relatively sensitive first current criteria based on a first current threshold value.

On a condition that at least one of the generated signal or signals indicates that there is a fault in the protected unit, a first derived signal indicating that there is a fault, e.g. a permanent fault, in the protected unit may be generated. On a condition that none of the generated signal or signals indicate that there is a fault, e.g. a permanent fault, in the protected unit, a first derived signal indicating that there is not a fault, e.g. a permanent fault, in the protected unit may be generated.

A voltage of the at least one current path in the protected unit, e.g. at one end of the protected unit, may be sensed. For example, a voltage between the at least one current path in the protected unit at one end of the protected unit and ground may be sensed. Compliance of the sensed voltage with a voltage criteria based on a voltage threshold value may be determined. On a condition that there is determined that the sensed voltage complies with the voltage criteria, a signal indicating that there is a fault, e.g. a permanent fault, in the protected unit may be generated. On a condition that there is determined that the sensed voltage complies with the voltage criteria, a signal indicating that there is not a fault, e.g. a permanent fault, in the protected unit may be generated. On a condition that both of the generated signal and the first derived signal indicate that there is a fault, e.g. a permanent fault, in the protected unit, a second derived signal indicating that there is a fault, e.g. a permanent fault, in the protected unit may be generated. On a condition that both of the generated signal and the first derived signal indicate that there is not a fault, e.g. a permanent fault, in the protected unit, a second derived signal indicating that there is not a fault, e.g. a permanent fault, in the protected unit may be generated.

The generation of first and second derived signals as described above will be further described below with reference to FIGS. 5-12, where for example the first derived signal can be represented by the signal output from the L1 logical unit and/or the L2 logical unit, and the second derived signal can be represented by the signal output from the L3 logical unit (FIGS. 5, 6, 8 and 9), or the first derived signal can be represented by the signal output from the L1 logical unit (FIGS. 7 and 10-12).

For example, a current in the at least one current path in the protected unit may be sensed during at least three different respective time instants $(t_1-t_0)$, $(t_2-t_0)$, $(t_3-t_0)$, where $t_0$ is a time at which the protected unit is connected to the at least a portion of the rest of the power system after having been disconnected or isolated from the at least a portion of the rest of the power system, and $t_3>t_2>t_1>t_0$. Thereby, at least three sensed currents $I(t_1-t_0)$, $I(t_2-t_0)$, and $I(t_3-t_0)$ may be obtained.

The time instant $(t_1-t_0)$ may for example be determined by a time for a fault current in the at least one current path in the protected unit to reach a maximum discharging or inrush current subsequent to the protected unit having been connected to the at least a portion of the rest of the power system after having been disconnected or isolated from the at least a portion of the rest of the power system, on a condition that the fault occurs close to or at a terminal, e.g. a voltage source converter, to which the protected unit is connected.

In the context of the present application, by the fault occurring close to or at a terminal, e.g. a voltage source converter, to which the protected unit is connected, it is meant that the fault occurs or is present at a maximum distance from the terminal of about a few percent or less of the length of the at least one current path, e.g. including a power transmission line. For example, in case the length of the power transmission line is between 500 km to 1000 km, the fault occurring close to a terminal, e.g. a voltage source converter, to which the protected unit is connected may mean that the fault occurring within a few kilometers, e.g. two to five kilometers or more, from the terminal.

The time instant $(t_2-t_0)$ may for example be determined by a time for a fault current in the at least one current path in the protected unit to reach the first current threshold value on a condition that the fault occurs at or close to a middle point of the at least one current path in the protected unit.

In the context of the present application, by the fault occurring at or close to a middle point of the at least one current path, it is meant that the fault occurs or is present at a maximum distance from the middle point of the at least one current path of about a few percent or less of the length of the at least one current path.

The time instant $(t_3-t_0)$ may for example be determined by a time for a fault current in the at least one current path in the protected unit to reach the first current threshold value on a condition that the fault occurs at or close to an end point of the at least one current path in the protected unit.

In the context of the present application, by the fault occurring at or close to an end point of the at least one current path, it is meant that the fault occurs or is present at a maximum distance from the end point of the at least one current path of about a few percent or less of the length of the at least one current path.

By sensing a current in the at least one current path in the protected unit during different respective time instants, e.g. during at least three different respective time instants $(t_1-t_0)$, $(t_2-t_0)$, $(t_3-t_0)$ as described in the foregoing, detection of fault in the protected unit with speed faster than so called over-current protection schemes may be facilitated, and/or detection of any fault occurring over the whole or substantially the whole of the length of the at least one current path, with relatively high speed and/or speed comparable to a speed of a primary protection system for detecting faults in such a protected unit, may be facilitated.

According to another example, a current in the at least one current path in the protected unit may be sensed continuously during a time window $(t_1-t_0)$, where $t_0$ is a time at which the protected unit is connected to the at least a portion of the rest of the power system after having been disconnected or isolated from the at least a portion of the rest of the power system, and $t_1$ is a time such that $t_1>t_0$. The time window $(t_1-t_0)$ may for example be determined by a time for a fault current in the at least one current path in the protected unit to reach the first current threshold value on a condition that the fault occurs at or close to an end point of the at least one current path in the protected unit. Determining compliance of at least one of the sensed currents with a respective first current criteria based on a first current threshold value may for example comprise determining at least one quotient of a difference between currents $I(t>t_0)$ and $I(t_0)$, where t denotes time, and a difference between t and $t_0$, and comparing the determined at least one quotient during the time window $(t_1-t_0)$ with a current slope threshold value, wherein the current slope threshold value constitutes the first current threshold value.

Determining compliance of at least one of the sensed currents with a respective first current criteria based on a first current threshold value may for example comprise determining a quotient of a difference between currents $I(t_1)$ and $I(t_0)$ and a difference between $t_1$ and $t_0$, and comparing the quotient with a current slope threshold value, wherein the current slope threshold value constitutes the first current threshold value.

For example, on a condition that the quotient exceeds the current slope threshold value, compliance of at least one of the sensed currents with a respective first current criteria based on a first current threshold value may be determined, and a signal indicating that there is a fault, e.g. a permanent fault, in the protected unit may then be generated.

According to other examples, a current in the at least one current path in the protected unit may be sensed during at least three or four or more different respective time instants.

According to a second aspect of the present invention, there is provided a fault detection device for detection of a fault in a protected unit included in a power system, which protected unit is adapted to convey power via at least one current path therein. The protected unit can be selectively disconnected or isolated from at least a portion of the rest of the power system and the protected unit can be selectively connected to the at least a portion of the rest of the power system, e.g. after the protected unit has been isolated from the at least a portion of the rest of the power system. The fault detection device is adapted to facilitate detection of any fault, e.g. permanent fault, in the protected unit after the protected unit has been connected to the at least a portion of the rest of the power system, e.g. after the protected unit has been disconnected or isolated from the at least a portion of the rest of the power system. The fault detection device comprises a current sensor unit and a processing unit. The current sensor unit is adapted to sense a current in the at least one current path in the protected unit, e.g. at one end of the protected unit, during a plurality of different time periods, thereby obtaining a plurality of sensed currents. The processing unit is coupled to the current sensor unit, e.g. so as to at least enable communication of signals, messages, instructions and/or data between the processing unit and the current sensor unit. The processing unit is adapted to determine compliance of at least one of the sensed currents with a respective first current criteria based on a first current threshold value. The processing unit is adapted to, on a condition that there is determined that at least one of the sensed currents comply with the respective first current criteria, generate a signal indicating that there is a fault, e.g. a permanent fault, in the protected unit. The processing unit is adapted to, on a condition that there is determined that none of the sensed currents comply with the respective first current criteria, generate a signal indicating that there is not a fault, e.g. a permanent fault, in the protected unit.

The processing unit may be adapted to: determine the absolute value of at least one of the sensed currents, determine compliance of the absolute value with a second current criteria based on a second current threshold value, on a condition that there is determined that absolute value complies with the second current criteria, generate a signal indicating that there is a fault, e.g. a permanent fault, in the protected unit, and, on a condition that there is determined that the absolute value complies with the second current criteria, generate a signal indicating that there is not a fault, e.g. a permanent fault, in the protected unit.

The fault detection device may comprise a voltage sensor unit adapted to sense a voltage of the at least one current path in the protected unit, e.g. at one end of the protected unit. For example, the fault detection device may be adapted to sense a voltage between the at least one current path in the protected unit and ground at one end of the protected unit.

The processing unit may be adapted to: determine compliance of the sensed voltage with a voltage criteria based on a voltage threshold value, on a condition that there is determined that the sensed voltage complies with the voltage criteria, generate a signal indicating that there is a fault, e.g. a permanent fault, in the protected unit, and, on a condition that there is determined that sensed voltage complies with the voltage criteria, generate a signal indicating that there is not a fault, e.g. a permanent fault, in the protected unit.

According to a third aspect of the present invention, there is provided a power system including a protected unit adapted to convey power via at least one current path therein, wherein the protected unit can be selectively disconnected or isolated from at least a portion of the rest of the power system, and the protected unit can be selectively connected to the at least a portion of the rest of the power system, e.g. after the protected unit has been disconnected or isolated from the at least a portion of the rest of the power system. The power system includes a fault detection device according to the second aspect of the present invention, which fault detection device is adapted to facilitate detection of any fault, e.g. permanent fault, in the protected unit after the protected unit has been connected to the at least a portion of the rest of the power system, e.g. after the protected unit has been disconnected or isolated from the at least a portion of the rest of the power system.

The power system may comprise at least one DC circuit breaker adapted to selectively disconnect or isolate the protected unit from the at least a portion of the rest of the power system upon receipt of a disconnection signal, and selectively connect the protected unit to the at least a portion of the rest of the power system upon receipt of a connection signal. The fault detection device is communicatively coupled to the at least one DC circuit breaker, e.g. so as to at least enable communication of signals, messages, instructions and/or data between the fault detection device and the at least one DC circuit breaker. The processing unit of the fault detection device is adapted to, on a condition that at least one of the generated signals indicate that there is a fault, e.g. a permanent fault, in the protected unit, generate a disconnection signal and transmit the disconnection signal to the at least one DC circuit breaker, whereby the protected unit becomes disconnected or isolated from the at least a portion of the rest of the power system.

The power system may for example comprise a High Voltage Direct Current (HVDC) power transmission system.

According to a fourth aspect of the present invention, there is provided a computer program product adapted to be executed in a processing unit of a fault detection device in a power system. The computer program product comprises computer-readable means carrying computer program code. The power system includes a protected unit that can be selectively isolated from at least a portion of the rest of the power system and that can be selectively re-connected to the at least a portion of the rest of the power system after having been isolated from the at least a portion of the rest of the power system. The fault detection device is adapted to facilitate detection of any fault in the protected unit after the protected unit has been re-connected to the at least a portion of the rest of the power system after having been isolated from the at least a portion of the rest of the power system. The fault detection device comprises a current sensor unit coupled to the processing unit. The current sensor unit is adapted to sense a current in the at least one current path in the protected unit, e.g. at one end of the protected unit, at least once. The computer program code is configured to, when executed in the processing unit of the fault detection device, cause the current sensor unit to sense a current in the at least one current path in the protected unit e.g. at one end of the protected unit during a plurality of different time periods, thereby obtaining a plurality of sensed currents. The computer program code is configured to, when executed in the processing unit of the fault detection device, determine compliance of at least one of the sensed currents with a respective first current criteria based on a first current threshold value. The computer program code is configured to, when executed in the processing unit of the fault detection device, on a condition that there is determined that at least one of the sensed currents comply with the respective first current criteria, generate a signal indicating that there is a fault in the protected unit, and, on a condition that there is determined that none of the sensed currents comply with the respective first current criteria, generate a signal indicating that there is not a fault in the protected unit.

The processing unit of the fault detection device may include or be constituted by any suitable central processing unit (CPU), microcontroller, digital signal processor (DSP), Application Specific Integrated Circuit (ASIC), Field Programmable Gate Array (FPGA), etc., or any combination thereof. The processing unit may optionally be capable of executing software instructions stored in a computer program product e.g. in the form of a memory. The memory may for example be any combination of read and write memory (RAM) and read-only memory (ROM). The memory may comprise persistent storage, which for example can be a magnetic memory, an optical memory, a solid state memory or a remotely mounted memory, or any combination thereof.

Further objects and advantages of the present invention are described in the following by means of exemplifying embodiments.

It is noted that the present invention relates to all possible combinations of features recited in the claims. Further features of, and advantages with, the present invention will become apparent when studying the appended claims and the following description. Those skilled in the art will realize that different features of the present invention can be combined to create embodiments other than those described in the following.

BRIEF DESCRIPTION OF THE DRAWINGS

Exemplifying embodiments of the invention will be described below with reference to the accompanying drawings, in which.

Figure 1:
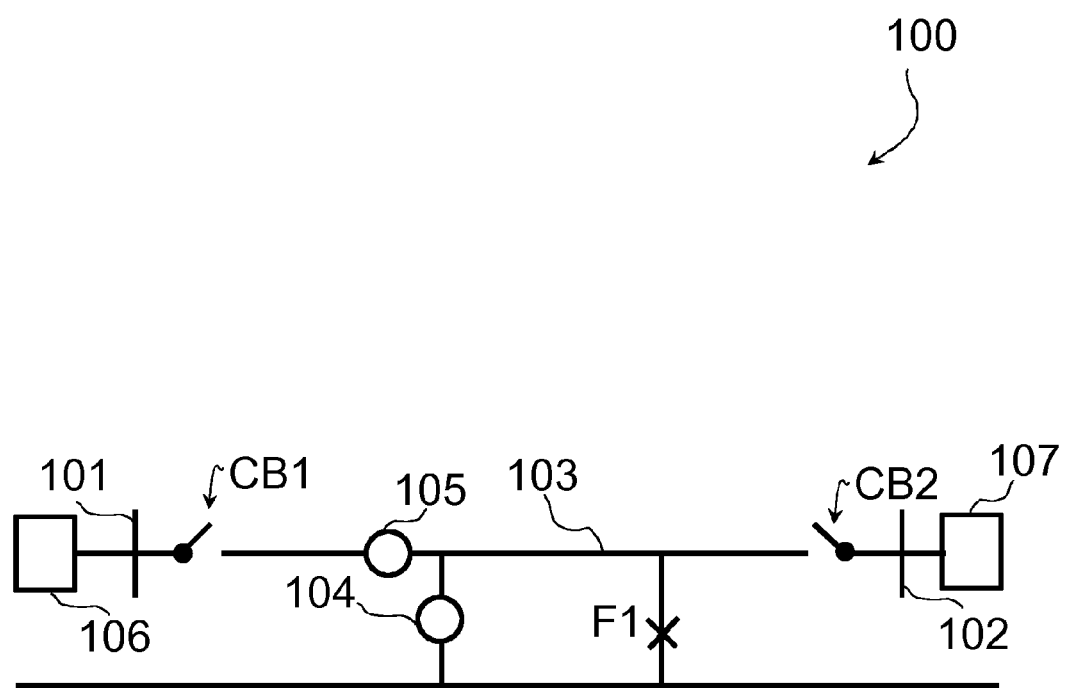
FIG. 1 is a circuit representation that illustrates a section of a power system according to an example.

In the accompanying drawings, the same reference numerals denote the same or similar elements throughout the views. All the figures are schematic, not necessarily to scale, and generally only show parts which are necessary in order to elucidate the invention, wherein other parts may be omitted or merely suggested.

DETAILED DESCRIPTION OF THE INVENTION

The present invention will now be described more fully hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the invention to those skilled in the art. Furthermore, like numbers refer to like or similar elements or components throughout. The steps of any method described herein do not have to be performed in the exact order as described, unless specifically stated.

In DC grid systems, fault isolation is anticipated to be carried out utilizing DC circuit breakers without shutting down converters. Such a strategy is intended to preserve the integrity of the DC grid by allowing rerouting of DC power through other, non-faulty, DC lines. Even remote faults could potentially lead to so called voltage collapse, so it is desirable that DC circuit breakers open relatively quickly. For a DC overhead line (OHL), a fault could be either a temporary fault or a permanent fault. To protect the DC grid system against temporary faults, or even to secure or maintain operation of the DC grid system when temporary faults occur, DC circuit breaker auto reclosing is anticipated to be a part of the recommended operating procedure for DC grids. In the case of a permanent fault, the primary protection system should be able to detect the fault following auto reclosing, and then again disconnect the faulty DC line. Similarly, it is also expected that the primary protection system should be operational during DC line switching operations.

Primary protections have been designed to detect positive (negative) rate of rise of DC currents and negative (positive) rate of rise of DC voltage of the DC line subsequent to a fault occurring, which protection scheme involves the positive (negative) pole under normal DC line operating conditions.

However, these current and voltage time derivative based primary protections which are designed to protect the DC line under normal operating conditions may not be able to detect permanent faults sufficiently quickly and reliably following DC circuit breaker auto reclosing.

Referring now to FIG. 1, which shows a circuit representation which illustrates a section of a multi-terminal High Voltage Direct Current (HVDC) grid 100, a protected unit 103 in the form of a transmission line 103, here examplified by a DC OHL 103, interconnects buses 101 and 102. A voltage sensor 104 and a current sensor 105 are arranged on the line side, which voltage sensor 104 and a current sensor 105 are used by a primary protection system (not shown in FIG. 1) in order to trip circuit breaker CB1 in case of DC OHL 103 faults. The current in one end of the transmission line 103, e.g. the end of the transmission line 103 on the left-hand side of FIG. 1, is measured by the current sensor 105 and the voltage in one end of the transmission line 103 between the transmission line 103 and ground is measured by the voltage sensor 104. At the other end of the transmission line 103, i.e. the end of the transmission line 103 on the right-hand side of FIG. 1, there may be arranged a voltage sensor and current sensor (not shown in FIG. 1) similarly as voltage sensor 104 and current sensor 105, which e.g. may substantially measure the voltage and current in the other end of the protected unit 103 to supply signal inputs to the primary protection system (not shown in FIG. 1) to trip circuit breaker CB2 in case of DC OHL 103 faults so that the complete DC OHL 103 could be disconnected by CB1 and CB2 if there is a fault in DC OHL 103. Following a fault F1 in the transmission line 103, it will be isolated from the rest of the HVDC grid 100 by opening of circuit breakers CB1, CB2 arranged at both ends of the transmission line 103, as illustrated in FIG. 1, which shows both of the circuit breakers CB1, CB2 in an open state. While the circuit breakers CB1, CB2 are kept opened for a certain period of time before auto reclosing, the transmission line 103 is un-energized from both sides of the transmission line 103. The voltage sensor 104 and the current sensor 105 in one of the ends of the transmission line 103 are arranged on the line side, and before auto reclosing of the circuit breaker CB1, the voltage sensor 104 and the current sensor 105 will therefore exhibit negligible voltage and current readings, respectively. When the circuit breakers CB1, CB2 auto reclose, converters 106, 107 will provide grid voltage in the transmission line 103. Thus, the voltage in the transmission line 103 will jump to the rated line voltage shortly after auto reclosing of the circuit breakers CB1, CB2. Once the fault F1 begins to draw current, the voltage in the transmission line 103 will start to diminish and eventually be reduced to zero or substantially zero if the fault F1 is not isolated. Thus, following auto reclosing of the circuit breakers CB1, CB2, the positive (negative) pole primary protection system will initially 'see' positive (negative) rate of rise of voltage. When utilizing voltage derivative based fault detection criteria, the signs of voltage derivatives following a fault occurring and auto reclosing are in general opposite and the initial voltage derivatives under permanent and temporary fault conditions may be quite close following auto reclosing. When the circuit breakers CB1, CB2 auto recloses, the current in the transmission line 103 will increase. The rate of increase of the current in the transmission line 103 may be limited by the reactors and the reactance of the transmission line 103. The fault current is initially contributed to by capacitive devices included in the HVDC grid 100, and is after some time fed by the AC grid and other sources directly connected to the HVDC grid 100. Eventually, the fault current will reach a maximum value at steady state if the fault F1 is not isolated. Thus, following auto reclosing of the circuit breakers CB1, CB2, the positive (negative) pole primary protection will 'see' positive (negative) rate of rise of current. When utilizing current derivative based fault detection criteria, the initial current derivatives following a fault occurring and auto reclosing may be almost the same and the initial current derivatives under permanent and temporary fault conditions may be almost the same following auto reclosing.

Similar concerns apply when switching a circuit breaker to energize an open transmission line. In energizing a transmission line, a protection system needs to be in operation in order to detect a possible fault. Energizing an open transmission line by closing a circuit breaker will result in positive (negative) rate of rise of voltage in the positive (negative) pole. The initial voltage and current derivatives when switching to a non-faulty transmission line and when switching to a transmission line in which a fault is present may be almost the same.

Figure 2:
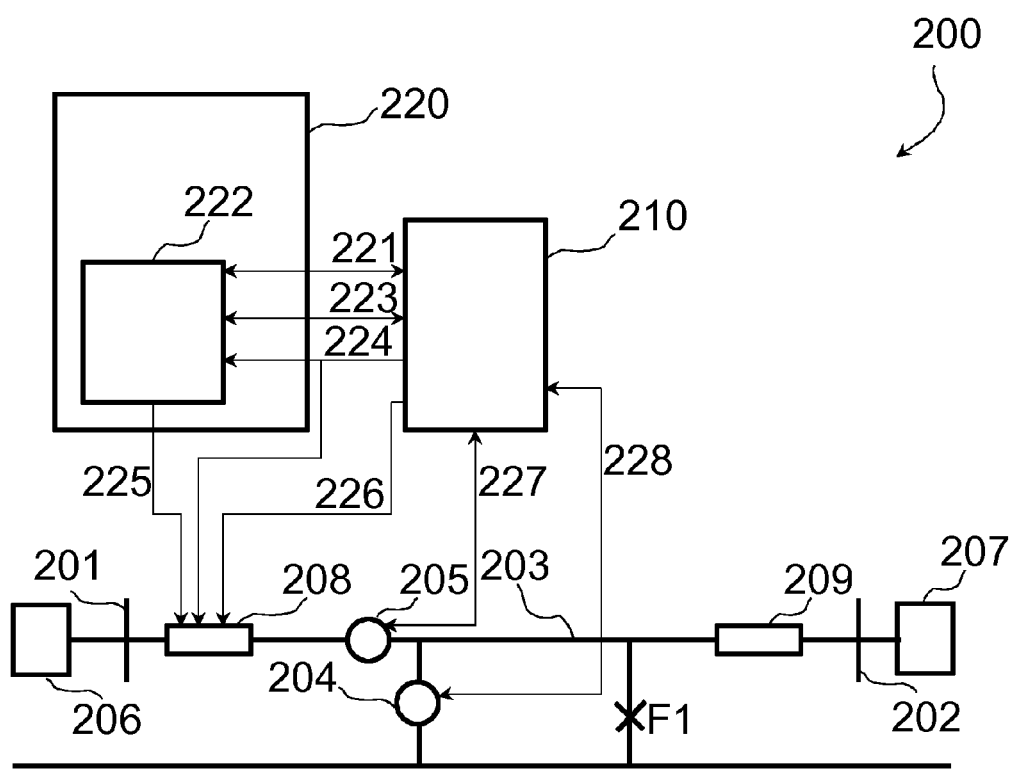
FIGS. 2 and 3 are circuit representations that illustrate a section of respective power systems in accordance with embodiments of the present invention.

Referring now to FIG. 2 there is shown a circuit representation which illustrates a section of a power system 200 exemplified by a multi-terminal High Voltage Direct Current (HVDC) grid 200, in accordance with an embodiment of the present invention. The power system 200 includes a protected unit 203, which protected unit 203 is adapted to convey power via at least one current path (not explicitly indicated in FIG. 2) therein. According to the embodiment depicted in FIG. 2, the protected unit 203 includes a transmission line 203, here exemplified by a DC OHL 203. The protected unit 203, which in the following will mostly be referred to as transmission line 203, interconnects buses 201 and 202. A voltage sensor 204 and a current sensor 205 are arranged on the line side at one end of the transmission line 203, e.g. the end of the transmission line 203 on the left-hand side of FIG. 2. The current through the transmission line 203 in one end of the transmission line 203 is measured by the current sensor 205 and the voltage in one end of the transmission line 203 between the transmission line 203 and ground is measured by the voltage sensor 204. The transmission line 203 can be selectively disconnected or isolated from at least a portion of the rest of the power system 200, and the transmission line 203 can be selectively connected to the at least a portion of the rest of the power system 200, e.g. after the transmission line 203 has been isolated from the at least a portion of the rest of the power system 200, by means of opening, or tripping, and/or closing at least one of DC circuit breakers 208, 209. For example, the circuit breakers 208, 209 can be tripped following a fault F1 on the transmission line 203 and then auto reclosed after a certain period of time. When the circuit breakers 208, 209 auto reclose, converters 206, 207 can provide grid voltage in the transmission line 203.

The power system 200 includes a transmission line 203 protection system 210 for protection of the transmission line 203, and possibly at least a portion of the rest of the power system 200, against faults occurring in the transmission line 203.

The power system 200 includes a fault detection device 220 coupled to the protection system 210. The fault detection device 220 is adapted to detect any fault F1, e.g. a permanent fault, in the transmission line 203 after the transmission line 203 has been connected to the at least a portion of the rest of the power system 200, e.g. after the transmission line 203 has been disconnected or isolated from the at least a portion of the rest of the power system 200. The fault detection device 220 comprises a current sensor unit and a processing unit 222.

According to the embodiment depicted in FIG. 2, the current sensor unit of the fault detection device 220 is embodied by means of the current sensor 205 coupled to the fault detection device 220 via the protection system 210. However, the current sensor unit of the fault detection device 220 may be constituted by at least one current sensor directly coupled to the fault detection device 220, which at least one current sensor is adapted to measure current in the transmission line 203.

The current sensor unit 205 is adapted to sense a current in the transmission line 203, or in the at least one current path in the protected unit 203, during a plurality of different time periods, thereby obtaining a plurality of sensed currents, indicated by reference numeral 227 in FIG. 2. As illustrated in FIG. 2, the processing unit 220 is coupled to the current sensor unit, e.g. so as to at least enable communication of signals, messages, instructions and/or data between the processing unit 222 and the current sensor unit 205. As indicated by reference numeral 221 in FIG. 2, the sensed currents or sensed current values can be conveyed to the processing unit 222 of the fault detection device 220 via the protection system 210.

The fault detection device 220 may comprise a voltage sensing unit adapted to sense a voltage of the transmission line 203 or a voltage of the at least one current path in the protected unit 203, e.g. to sense a voltage between the transmission line 203 and ground or a voltage between the at least one current path in the protected unit 203 and ground.

According to the embodiment depicted in FIG. 2, the voltage sensor unit of the fault detection device 220 is embodied by means of the voltage sensor 204 coupled to the fault detection device 220 via the protection system 210. However, the voltage sensor unit of the fault detection device 220 may be constituted by at least one voltage sensor directly coupled to the fault detection device 220, which at least one voltage sensor is adapted to measure voltage of the transmission line 203 or protected unit 203.

The voltage sensor unit 204 is coupled to the processing unit 222, e.g. so as to at least enable communication of signals, messages, instructions and/or data between the processing unit 222 and the voltage sensor unit 204. In FIG. 2, the communication of sensed voltage or sensed voltage value is indicated by reference numeral 228. As indicated by reference numeral 223 in FIG. 2, sensed voltage or sensed voltage value can be conveyed to the processing unit 222 of the fault detection device 220 via the protection system 210.

The processing unit 222 is adapted to determine compliance of at least one of the sensed currents with a respective first current criteria based on a first current threshold value. The processing unit 222 is adapted to, on a condition that there is determined that at least one of the sensed currents comply with the respective first current criteria, generate a signal indicating that there is a fault F1, e.g. a permanent fault, in the transmission line 203, which generated signal or a signal derived based on the generated signal may be transmitted to the circuit breaker 208, as indicated by reference numeral 225 in FIG. 2, and/or to circuit breaker 209 so as to cause the circuit breaker 208 and/or circuit breaker 209 to open or to be tripped. The processing unit 222 may be adapted to, on a condition that there is determined that none of the sensed currents comply with the respective first current criteria, generate a signal indicating that there is not a fault, e.g. a permanent fault, in the transmission line 203.

The protection system 210 may be adapted to transmit a signal, indicated in FIG. 2 by reference numeral 226, to circuit breaker 208 so as to cause the circuit breaker 208 to open. In addition or in alternative, the protection system 210 may be adapted to transmit a signal to circuit breaker 209 so as to cause the circuit breaker 209 to open (not shown in FIG. 2).

The protection system 210 may be adapted to transmit a signal to the circuit breaker 208 so as to cause the circuit breaker 208 to auto reclose, indicated in FIG. 2 by reference numeral 224. In addition or in alternative, the protection system 210 may be adapted to transmit a signal to circuit breaker 209 so as to cause the circuit breaker 209 to auto reclose (not shown in FIG. 2). The signal 224 may in alternative or in addition be transmitted to the fault detection device 220, which in turn can convey the signal 224 to the circuit breaker 208. This will be further described in the following.

At the other end of the transmission line 203, i.e. at the end of the transmission line 203 on the right-hand side of FIG. 2, there may be arranged a voltage sensor and current sensor (not shown in FIG. 2) which e.g. may substantially mirror or be similar to the arrangement of voltage sensor 204 and current sensor 205, respectively. Similarly, at the other end of the transmission line 203 there may be arranged a fault detection device and possibly a protection system similar to or the same as the fault detection device 220 and protection system 210. The operation of fault detection device and/or the protection system with respect to the circuit breaker 209 may be similar to or the same as the operation of the fault detection device 220 and protection system 210, respectively, with respect to the circuit breaker 208 such as described in the foregoing. In other words, even though FIG. 2 indicates sensing of current and voltage in the transmission line 203 only at one end of the transmission line 203 for purpose of fault detection, it is to be understood that this is merely for illustrating principles of the embodiments of the present invention and should not be considered as limiting. Rather, it is to be understood that that such sensing of current and voltage can be implemented at both ends of the transmission line 203 so as to facilitate or even enable fault detection in the transmission line 203 at both ends of the transmission line 203, where the fault detection operating principles in both ends of the transmission line 203 are similar or the same.

It is to be understood that the circuit representation in FIG. 2 which illustrates a section of the power system 200 is schematic and not drawn to scale. For example, although in FIG. 2 the distance between the ends of the transmission line 203, e.g. the distance between voltage sensor 204 and/or current sensor 205 and circuit breaker 209, might appear small, the transmission line 203 may be arranged such that the distance is relatively large, e.g. between 500 km and 1000 km.

Figure 3:
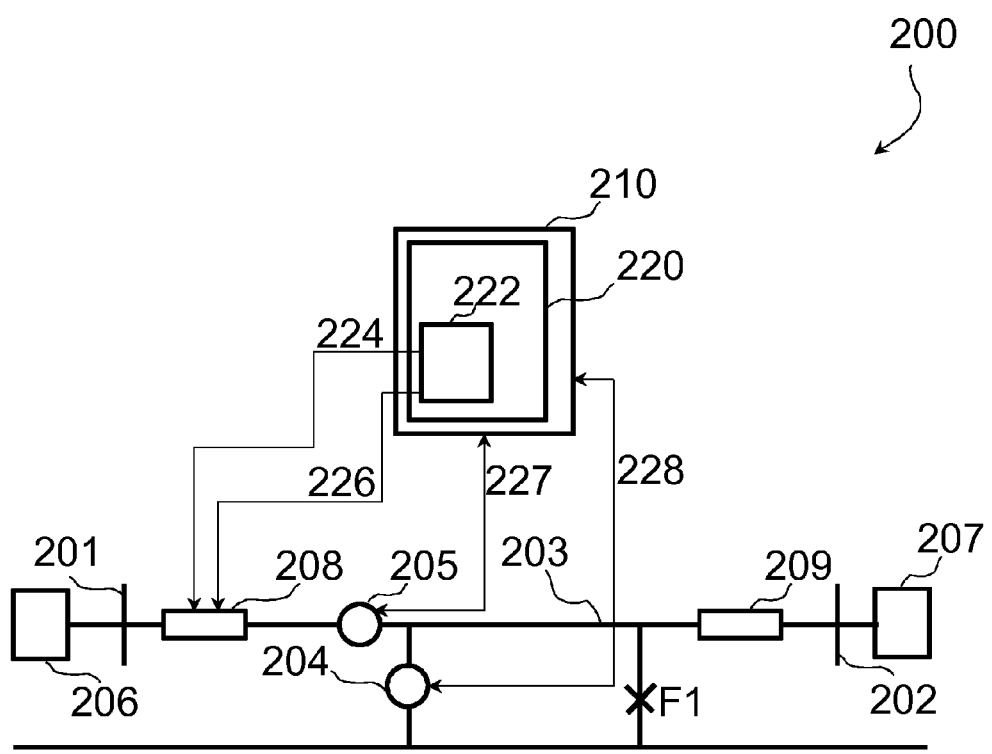

Referring now to FIG. 3 there is shown a circuit representation that illustrates a section of a power system 200 exemplified by a multi-terminal High Voltage Direct Current (HVDC) grid 200, in accordance with another embodiment of the present invention. The embodiment depicted in FIG. 3 differs from the embodiment depicted in FIG. 2 by the fault detection device 220 being integrally arranged in the protection system 210. Like numbers refer to like or similar elements or components in FIGS. 2 and 3. In FIG. 3, the processing unit 222 is adapted to, on a condition that there is determined that at least one of the sensed currents comply with the respective first current criteria, generate a signal indicating that there is a fault F1, e.g. a permanent fault, in the transmission line 203, which generated signal or a signal derived based on the generated signal may be transmitted to the circuit breaker 208, as indicated by reference numeral 226 in FIG. 3.

It is to be noted that although FIGS. 2 and 3 indicate the situation where principles of embodiments of the present invention are implemented at one terminal or terminal station only to which the transmission line 203 is connected, this is not to be seen as limiting. Rather, principles of embodiments of the present invention such as described with reference to FIG. 2 or 3 can be implemented at a selected number of terminals or terminal stations included in the power system 200, or even at each terminal or terminal station included in the power system 200.

After a circuit breaker 208 at one terminal has auto reclosed, another terminal, e.g. the one on the right-hand side in FIG. 2 or 3, could check a voltage of the transmission line 203, e.g. a voltage between the transmission line 203 and ground, in order to determine if a fault persists in the transmission line 203. On a condition that the voltage check confirms that there is a fault persisting, the circuit breaker 209 may be blocked or prevented from auto reclosing. No communication, e.g. signalling or communication of data and/or instructions, between the terminals may be required. The voltage check may for example include comparing the voltage with a certain threshold value. In case the voltage falls below the threshold value an auto reclosing signal (cf. FIGS. 5-7 and 11) is blocked, since a relatively low voltage could be an indication of a permanent fault. The above-described example of implementation of auto reclosing of the circuit breakers 208, 209 at both ends of the transmission line 203 is illustrated in FIG. 13, which shows a circuit representation that illustrates a section of a power system 200 exemplified by a multi-terminal High Voltage Direct Current (HVDC) grid 200, in accordance with an embodiment of the present invention.

Figure 13:
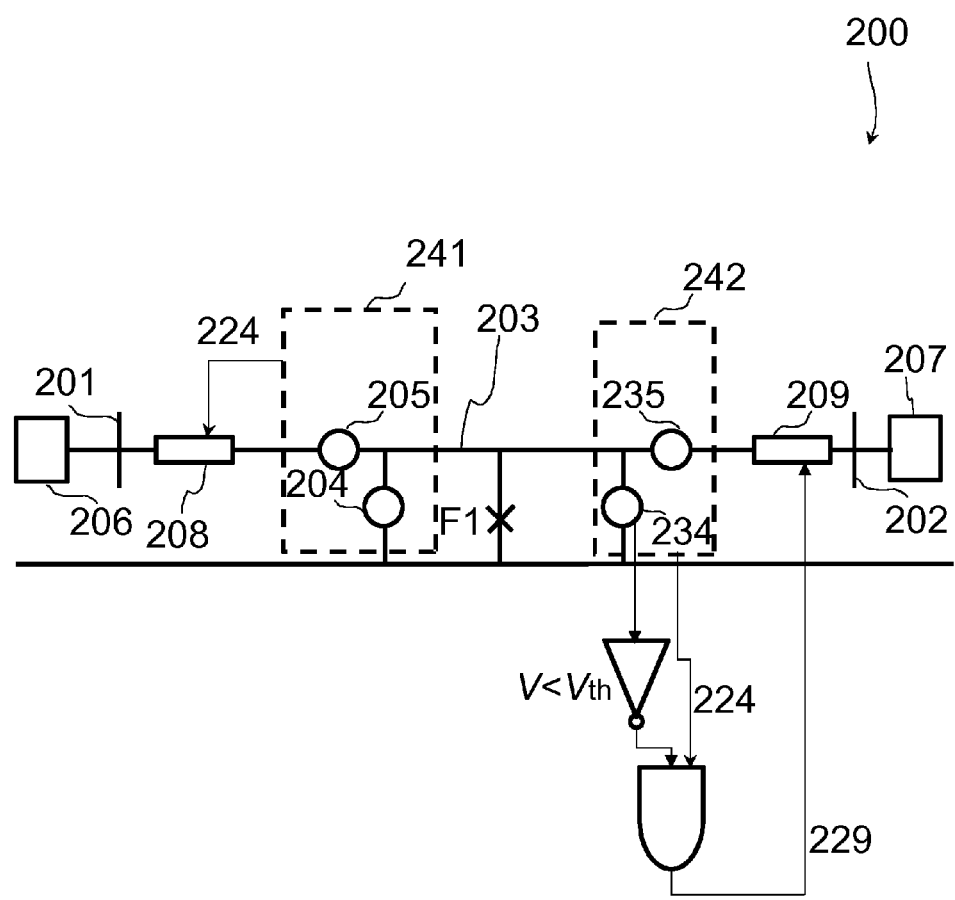
FIG. 13 is a circuit representation that illustrate a section of a power system in accordance with an embodiments of the present invention.

According to the embodiment depicted in FIG. 13, the protected unit 203 includes a transmission line 203, here exemplified by a DC OHL 203. The protected unit 203, which in the following will mostly be referred to as transmission line 203, interconnects buses 201 and 202. A voltage sensor 204 and a current sensor 205 are arranged on the line side at one end of the transmission line 203. A voltage sensor 234 and a current sensor 235 are arranged on the line side at the other end of the transmission line 203. The currents through the transmission line 203 in the respective ends of the transmission line 203 are measured by the current sensors 205 and 235, respectively, and the voltages in the respective ends of the transmission line 203 between the transmission line 203 and ground are measured by the voltage sensors 204 and 234, respectively. The transmission line 203 can be selectively disconnected or isolated from at least a portion of the rest of the power system or HVDC grid 200, and the transmission line 203 can be selectively connected to the at least a portion of the rest of the power system 200, e.g. after the transmission line 203 has been isolated from the at least a portion of the rest of the power system 200, by means of opening, or tripping, and/or closing at least one of circuit breakers 208, 209. For example, the circuit breakers 208, 209 can be tripped following a fault F1 on the transmission line 203 and then auto reclosed after a certain period of time. When the circuit breakers 208, 209 auto reclose, converters 206, 207 can provide grid voltage in the transmission line 203.

The section of the HVDC grid 200 comprises a first fault protection and/or detection system 241 and a second fault protection and/or detection system 242. Each of the first fault protection and/or detection system 241 and the second fault protection and/or detection system 242 may include a fault detection device and possibly a protection system e.g. similar to or the same as the fault detection device 220 and protection system 210 described above with reference to FIG. 2 or 3.

It is to be understood that any possible couplings between the fault detection device and possibly the protection system, and between the fault detection device and/or the protection system and the current sensor 205, 235, the voltage sensor 204, 234, and/or the circuit breaker 208, 209 for e.g. enabling communication of signals, messages, instructions and/or data between the respective elements, such as the couplings described above with reference to FIG. 2 or 3, are not shown in FIG. 13.

The circuit breaker 208 at one end of the transmission line 203 may be auto reclosed, e.g. upon receipt of signal 224 causing the circuit breaker 208 to auto reclose. If the circuit breaker 208 is successfully reclosed, e.g. if a temporary fault has disappeared since the opening of the circuit breaker 208, voltage may be restored at the other end of the transmission line 203. As illustrated in FIG. 13, after the circuit breaker 208 has auto reclosed, e.g. upon receipt of signal 224 causing the circuit breaker 208 to auto reclose, a voltage V of the transmission line 203 at the other end of the transmission line 203 sensed by voltage sensor 234, e.g. a voltage between the transmission line 203 and ground, may be checked against a voltage threshold value $V_{th}$ in order to determine if a fault persists in the transmission line 203. As indicated in FIG. 13, the second fault protection and/or detection system 242 may be adapted to issue a signal 224 for causing the circuit breaker 209 to auto reclose. However, on a condition that the voltage check against the voltage threshold value $V_{th}$ confirms that there is a fault persisting in the transmission line 203, e.g. on a condition that $V<V_{th}$ as indicated in FIG. 13, the circuit breaker 209 may be blocked or prevented from auto reclosing. Otherwise, an auto reclosing signal 229 may be generated and transmitted to circuit breaker 209, causing it to auto reclose.

It is to be understood that the circuit representation in FIG. 13 which illustrates a section of the power system 200 is schematic and not drawn to scale. For example, although in FIG. 13 the distance between the ends of the transmission line 203, or the distance between the current sensor 205 and the current sensor 235 or the distance between the voltage sensor 204 and the voltage sensor 234, might appear small, the transmission line 203 may be arranged such that the distance is relatively large, e.g. between 500 km and 1000 km.

Figure 4:
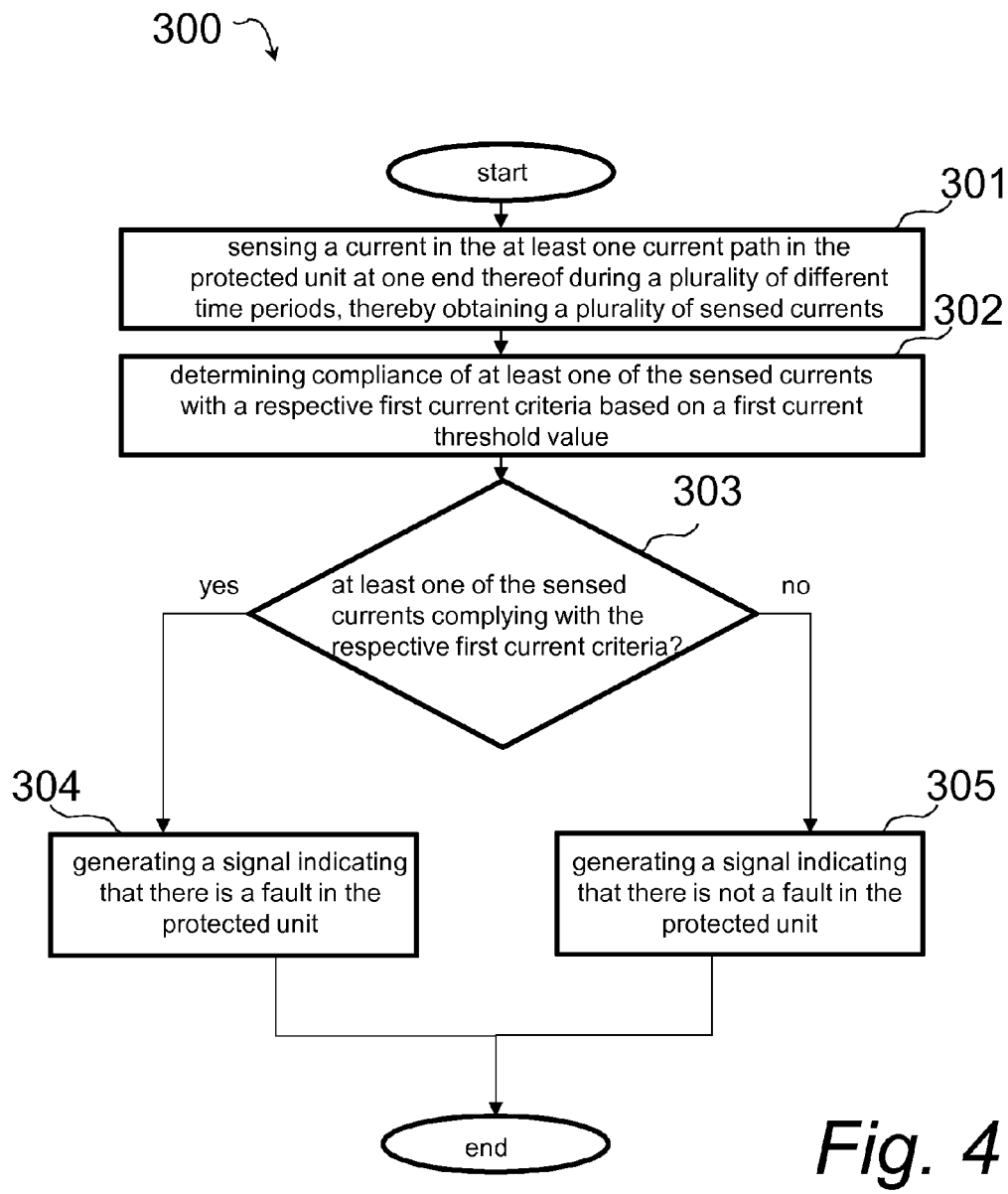
FIG. 4 is a schematic flowchart illustrating a method according to an embodiment of the present invention.

Referring now to FIG. 4, there is shown a schematic flowchart of a method 300 according to an embodiment of the present invention for use in fault detection in a protected unit included in a power system, e.g. a transmission line 203 included in the power system 200 described above with reference to FIG. 2, 3 or 13. The protected unit is adapted to convey power via at least one current path therein. The protected unit can be selectively disconnected from at least a portion of the rest of the power system and the protected unit can be selectively connected to the at least a portion of the rest of the power system.

The method 300 is for facilitating detection of any fault in the protected unit after the protected unit has been connected to the at least a portion of the rest of the power system. The method 300 comprises sensing a current in the at least one current path in the protected unit at one end thereof during a plurality of different time periods, thereby obtaining a plurality of sensed currents, 301.

Compliance of at least one of the sensed currents with a respective first current criteria based on a first current threshold value is determined, 302.

It is checked whether at least one of the sensed currents comply with the respective first current criteria, 303.

On a condition that there is determined that at least one of the sensed currents comply with the respective first current criteria, a signal indicating that there is a fault in the protected unit is generated, 304.

Otherwise, i.e. on a condition that there is determined that none of the sensed currents comply with the respective first current criteria, a signal indicating that there is not a fault in the protected unit is generated, 305.

The method 300 may be implemented in a fault detection device 220 such as described above with reference to FIG. 2 or 3. The logic for facilitating detection of any fault in the protected unit after the protected unit has been connected to the at least a portion of the rest of the power system, e.g. so as to decide whether to disconnect or isolate the protected unit from the at least a portion of the rest of the power system, will be described further with reference to FIGS. 5-12, each of which is a logic diagram illustrating a method according to an embodiment of the present invention. Any one of the methods illustrated in FIGS. 5-12 may be implemented in a fault detection device 220 such as described above with reference to FIG. 2 or 3. The logic steps may for example be implemented in the processing unit 222 of a fault detection device 220 such as described above with reference to FIG. 2 or 3.

Figure 5:
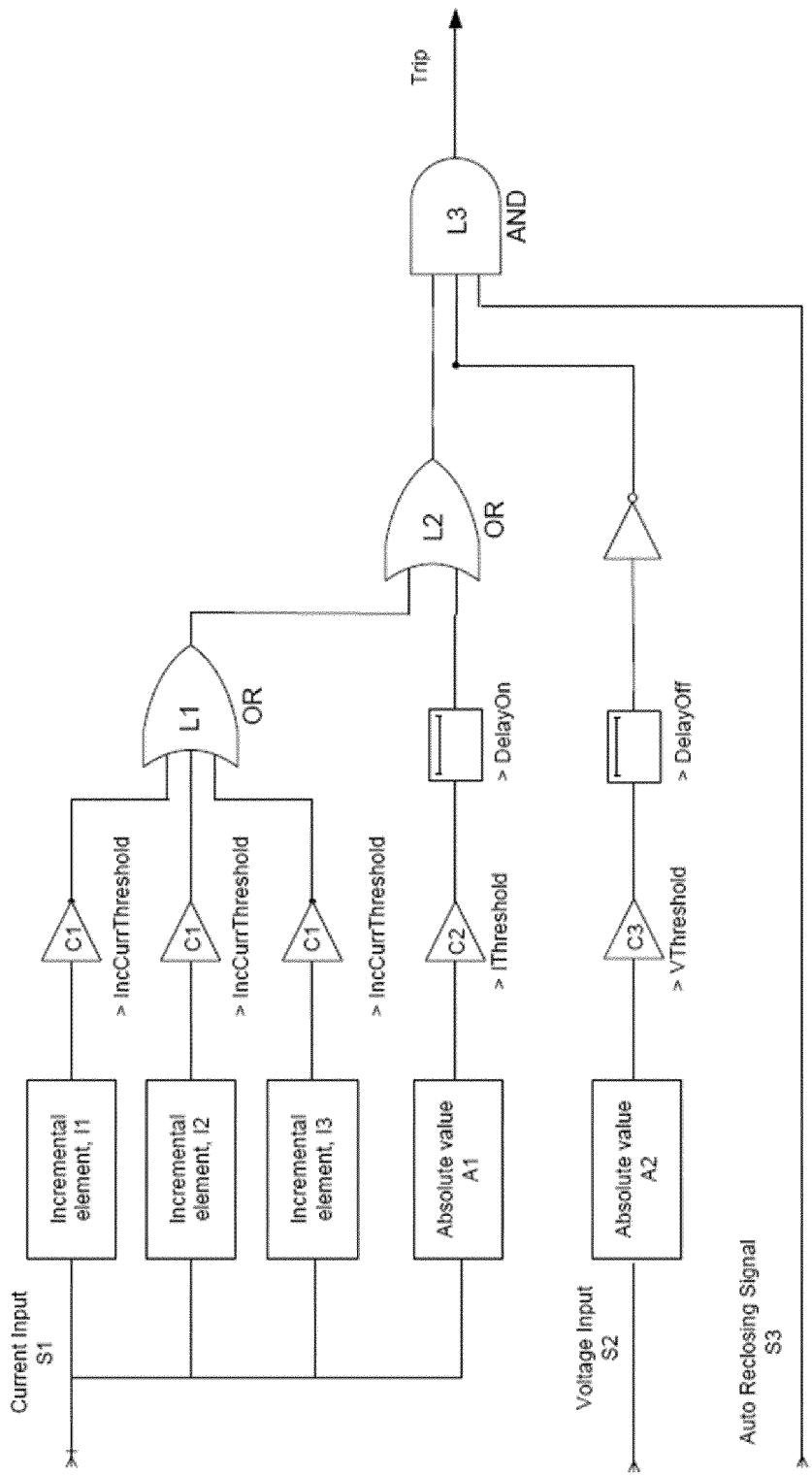
FIGS. 5-12 are logic diagrams illustrating methods according to embodiments of the present invention.

Referring now to FIG. 5, there is shown a logic diagram of a method according to an embodiment of the present invention that can be used to detect a permanent fault in the positive pole of a protected unit, which includes a bipolar HVDC transmission line, comprising a positive pole line, a negative pole line, and a metallic return line connected to ground. However, although FIG. 5 refers to the particular example of where the protected unit includes a bipolar HVDC transmission line, the present invention is not limited to that particular example, which has also already been discussed in the foregoing. Rather, the example of where the protected unit includes a bipolar HVDC transmission line is taken as one non-limiting example for the purpose of describing principles of embodiments of the present invention.

The method illustrated in FIG. 5 can be used to detect a permanent fault in the positive pole of the transmission line after circuit breakers have reclosed in the positive pole transmission line. There are three inputs S1, S2 and S3, corresponding to values of DC current, DC voltage, and DC circuit breaker auto reclosing signals, respectively.

According to the embodiment depicted in FIG. 5, an auto reclosing protection function is activated by receiving auto reclosing signal S3, which for example may be issued by a transmission line protection system such as the protection system 210 described with reference to FIG. 2 or 3. The auto reclosing protection function may in alternative or in addition be activated by receiving circuit breaker closing signals and/or by detecting a relatively fast rise of the line side voltage. Thus, it may be possible to use a combination of two or more of the above-mentioned auto reclosing protection function activators in order to activate the auto reclosing protection function.

According to embodiments of the present invention a current in the at least one current path in the transmission line is sensed during a plurality of different time periods, thereby obtaining a plurality of sensed currents. This is represented in FIG. 5 by several current incremental elements I1, I2 and I3, which accept current S1 as input and which are arranged for assessing whether a fault exists on the transmission line by comparing the plurality of sensed currents with a first current threshold value, "IncCurrThreshold". In the example depicted in FIG. 5 there are three current incremental elements but there may be only one current incremental element (described below with reference to e.g. FIG. 7) or two or four or more current incremental elements.

In the example depicted in FIG. 5 the current incremental elements I1, I2 and I3 evaluate the current values IIncCurr1 $(t_1-t_0)$, IIncCurr2$(t_2-t_0)$ and IIncCurr3$(t_3-t_0)$, respectively, and there can then be decided that a fault exists on the transmission line on a condition that IIncCurr1$(t_1-t_0)$>IncCurrThreshold, IIncCurr2$(t_2-t_0)$>IncCurrThreshold, or IIncCurr3$(t_3-t_0)$>IncCurrThreshold, as evaluated by logical unit L1, being an "OR"-element.

In the current incremental elements I1, I2, I3, $t_0$ is the time when the auto reclosing protection function is activated, e.g. the time when auto reclosing signal S3 is received, $t_1-t_0$ is the 'time window' for the current incremental element H, i.e. the time or instant at which the current IIncCurr1$(t_1-t_0)$ is sampled, and $t_2-t_0$ and $t_3-t_0$ are the time windows for the current incremental elements I2 and I3, respectively, i.e. the times or instants at which the currents IIncCurr2$(t_2-t_0)$ and IIncCurr3$(t_3-t_0)$ are sampled, respectively, where $t_3>t_2>t_1$. "IncCurrThreshold" is a positive value which may be predefined and higher than the value of a discharging or inrush current immediately following the transmission line having been reconnected to at least a portion of the rest of the power system or relatively close to after the transmission line has been reconnected to at least a portion of the rest of the power system, e.g. immediately following auto reclosing of the circuit breakers or relatively close in time to after auto reclosing of the circuit breakers.

The time or instant $t_1-t_0$ may be determined by a time for a fault current in the transmission line to reach a maximum discharging or inrush current immediately following the transmission line having been reconnected to at least a portion of the rest of the power system or relatively close in time to after the transmission line has been reconnected to at least a portion of the rest of the power system, on a condition that the fault occurs at a terminal or terminal station to which the transmission line is connected. The time or instant $t_2-t_0$ may be determined by a time for a fault current in the transmission line to reach the first current threshold value, IncCurrThreshold, on a condition that the fault occurs at a middle point of the transmission line. The time or instant $t_3-t_0$ may be determined by a time for a fault current in the transmission line to reach the first current threshold value, IncCurrThreshold, on a condition that the fault occurs at an end point of the transmission line.

An arrangement of current incremental elements I1, I2, I3 as described above may facilitate or even enable detection of 'close-in' faults following auto reclosing with speed faster than so called over-current protection schemes, and/or detection of any fault occurring over the whole or substantially the whole of the length of the transmission line, with relatively high speed and/or speed comparable to a speed of a primary protection system for detecting faults in the transmission line.

According to embodiments of the present invention a voltage of the transmission line is sensed, and compliance of the sensed voltage with a voltage criteria based on a voltage threshold value is determined. This is represented in FIG. 5 by an overvoltage blocking element A2 which accepts voltage S2 as input, and evaluates the absolute value of the voltage. The absolute value of the voltage is compared with a voltage threshold value, Vthreshold. When auto reclosing to a non-faulty transmission line, the line side voltage will initially 'jump' to rated line voltage and then oscillate about the rated line voltage, due to the nature of the RLC circuit. Eventually, this voltage will reach or substantially reach the rated line voltage value when steady state conditions have been attained. As illustrated in FIG. 5, the auto reclosing protection function will be blocked for a predefined "DelayOff" time once transient overvoltage is detected. Using such an overvoltage blocking element, the current incremental elements I1, I2, I3 may use relatively sensitive settings.

It is possible that the output of the logical unit L1 might be false even though there is a fault in the transmission line, or in other words, that a fault present in the transmission line could not be detected by means of the current incremental elements I1, I2, I3. A back-up current module C2 may check if the absolute value of the current exceeds a threshold, IThreshold. If that is the case, a signal indicative of that a fault is present in the transmission line may be generated after a predefined "DelayOn" time, provided the circuit breakers having auto reclosed prior to this condition being met and the transient overvoltage blocking element has not been activated. This signal is input into logical unit L2, being an "OR"-element. The output signal from the logical unit L1 is also input into logical unit L2, as illustrated in FIG. 5.

According to the embodiment depicted in FIG. 5, the signal generated by the overvoltage blocking element branch, the signal output from logical unit L2, and the auto reclosing signal S3 are all input into logical unit L3, being an "AND" element. In case the logical unit L3 determines a true condition a "Trip" signal, or disconnection signal, is issued to effect tripping or opening of the circuit breaker or circuit breakers.

Figure 6:
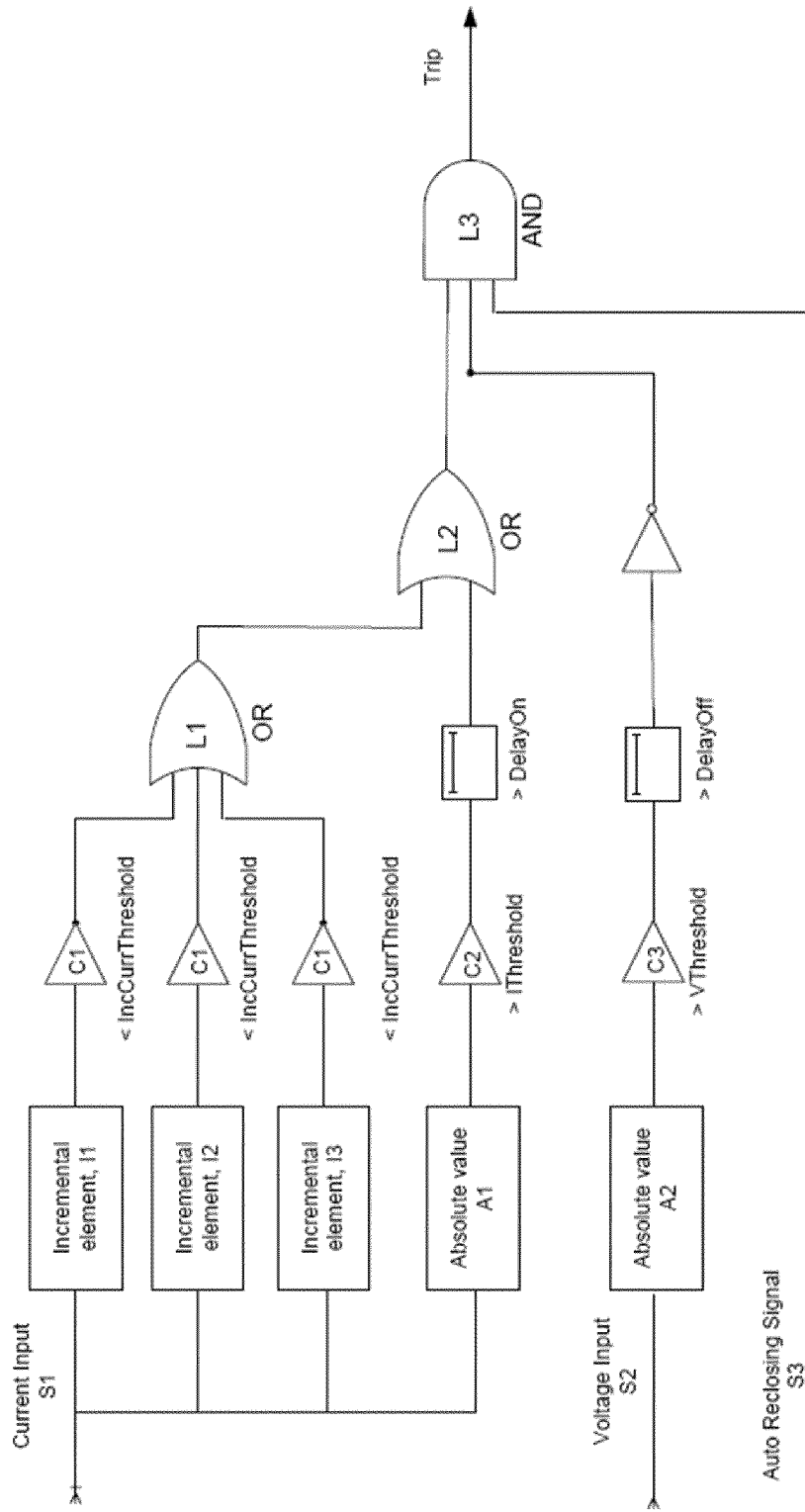

It is to be noted that for the case of the negative pole of the transmission line, the values output from the current incremental elements I1, I2, I3 will be negative following auto reclosing. FIG. 6 shows the slightly modified logic for the negative pole transmission line compared to the logic for positive pole transmission line illustrated in FIG. 5. In FIG. 6, the checks made in the C1 modules are based on a 'smaller than' threshold criteria, whereas in FIG. 5, the checks made in the C1 modules are based on a 'larger than' threshold criteria.

With reference to FIGS. 5, 6, 8 and 9, any one of the C1, C2 and C3 modules may for example be hysteresis in nature or based on level comparator, as appropriate.

With reference to FIGS. 7, 10, 11 and 12, any one of the C1 and C2 modules may for example be hysteresis in nature or based on level comparator, as appropriate.

For example, a reset value, IncCurrReset may be provided to the at least one of the C1 modules, which may facilitate or enable detection of relatively high incremental currents before the incremental currents return to a normal, or nominal, level.

Figure 7:
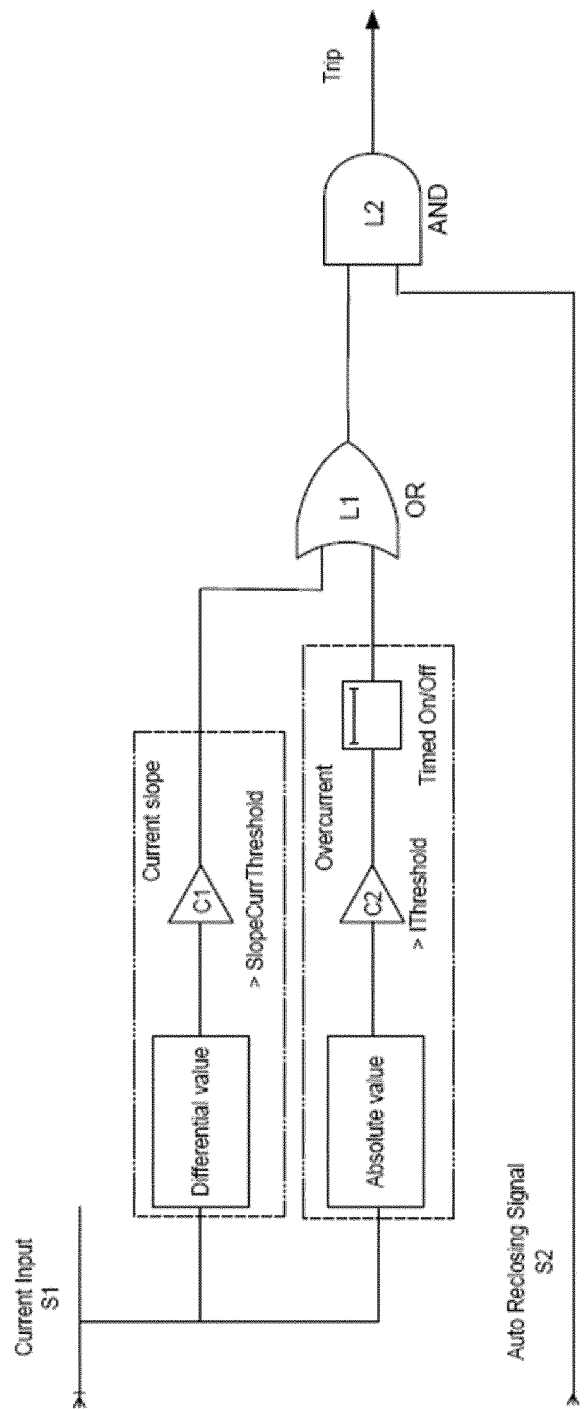

Referring now to FIG. 7, there is shown a logic diagram of a method according to an embodiment of the present invention that can be used to detect a permanent fault in the positive pole of a protected unit, which includes a bipolar HVDC transmission line, comprising a positive pole line, a negative pole line, and a metallic return line connected to ground. However, although FIG. 7 refers to the particular example of where the protected unit includes a bipolar HVDC transmission line, the present invention is not limited to that particular example, which has also already been discussed in the foregoing. Rather, the example of where the protected unit includes a bipolar HVDC transmission line is taken as one non-limiting example for the purpose of describing principles of embodiments of the present invention.

The method illustrated in FIG. 7 can be used to detect a permanent fault in the positive pole of the transmission line after circuit breakers have reclosed in the positive pole transmission line. There are two inputs S1 and S2, corresponding to values of DC current and DC circuit breaker auto reclosing signals, respectively.

According to the embodiment depicted in FIG. 7, an auto reclosing protection function is activated by receiving auto reclosing signal S2, which for example may be issued by a transmission line protection system such as the protection system 210 described with reference to FIG. 2 or 3. The auto reclosing protection function may in alternative or in addition be activated by receiving circuit breaker closing signals and/or by detecting a relatively fast rise of the line side voltage. Thus, it may be possible to use a combination of two or more of the above-mentioned auto reclosing protection function activators in order to activate the auto reclosing protection function.

According to embodiments of the present invention a current in the transmission line is sensed continuously during a time window $(t_1-t_0)$, where $t_0$ is a time at which the transmission line is connected to the at least a portion of the rest of the power system after having been disconnected from the at least a portion of the rest of the power system, e.g. the time when auto reclosing signal S2 is received, and $t_1$ is a time such that $t_1>t_0$. This is represented in FIG. 7 by a differential value current element which accepts current S1 as input and which is arranged to determine at least one quotient of a difference between currents $I(t>t_0)$ and $I(t_0)$, where t denotes time, and a difference between t and $t_0$, i.e. a differential current value. The differential current value or values are calculated or determined during the time window $(t_1-t_0)$, e.g. at different times t, and are compared to a current slope threshold value "SlopeCurrThreshold", cf. module C1, which current slope threshold value in this case constitutes the first current threshold value. The time window $(t_1-t_0)$ may for example be determined by a time for a fault current in the at least one current path in the protected unit to reach the first current threshold value, or current slope threshold value, on a condition that the fault occurs at an end point of the at least one current path in the protected unit.

The threshold value "SlopeCurrThreshold" may be a positive value which can be determined based on the inrush current to the surge impedance of the faulted protected unit or transmission line and possibly taking into account a certain margin. According to an example of a transmission line being constituted by an OHL having a length of about 400 km, the surge impedance may be about 295Ω and the inrush current about 1 kA. With a margin of 0.5 kA, "SlopeCurrThreshold" may according to the example be about 1.5 kA. According to the example of a transmission line being constituted by an OHL having a length of about 400 km, the time window $(t_1-t_0)$ may for example be about 4 ms.

The branch of the logic diagram in FIG. 7 including the current module C2 is similar to or the same as the branch of the logical diagram in FIG. 5 or 6 which includes current module C2.

Hence, a back-up current, or 'overcurrent', module C2 may check if the absolute value of the current exceeds a threshold, IThreshold. If that is the case, a signal indicative of that a fault is present in the transmission line may be generated after a predefined time, indicated in FIG. 7 by "Timed On/Off", provided the circuit breakers have auto reclosed prior to this condition being met and the transient overvoltage blocking element has not been activated. This signal is input into logical unit L1, being an "OR"-element, together with the output from module C1, as illustrated in FIG. 7.

According to an example of a transmission line being constituted by an OHL having a length of about 400 km, the threshold IThreshold may for example be about 3.5 kA and the predefined time about 0.5 ms, or the threshold (threshold may be about 2 kA and the predefined time 2.5 ms.

Figure 8:
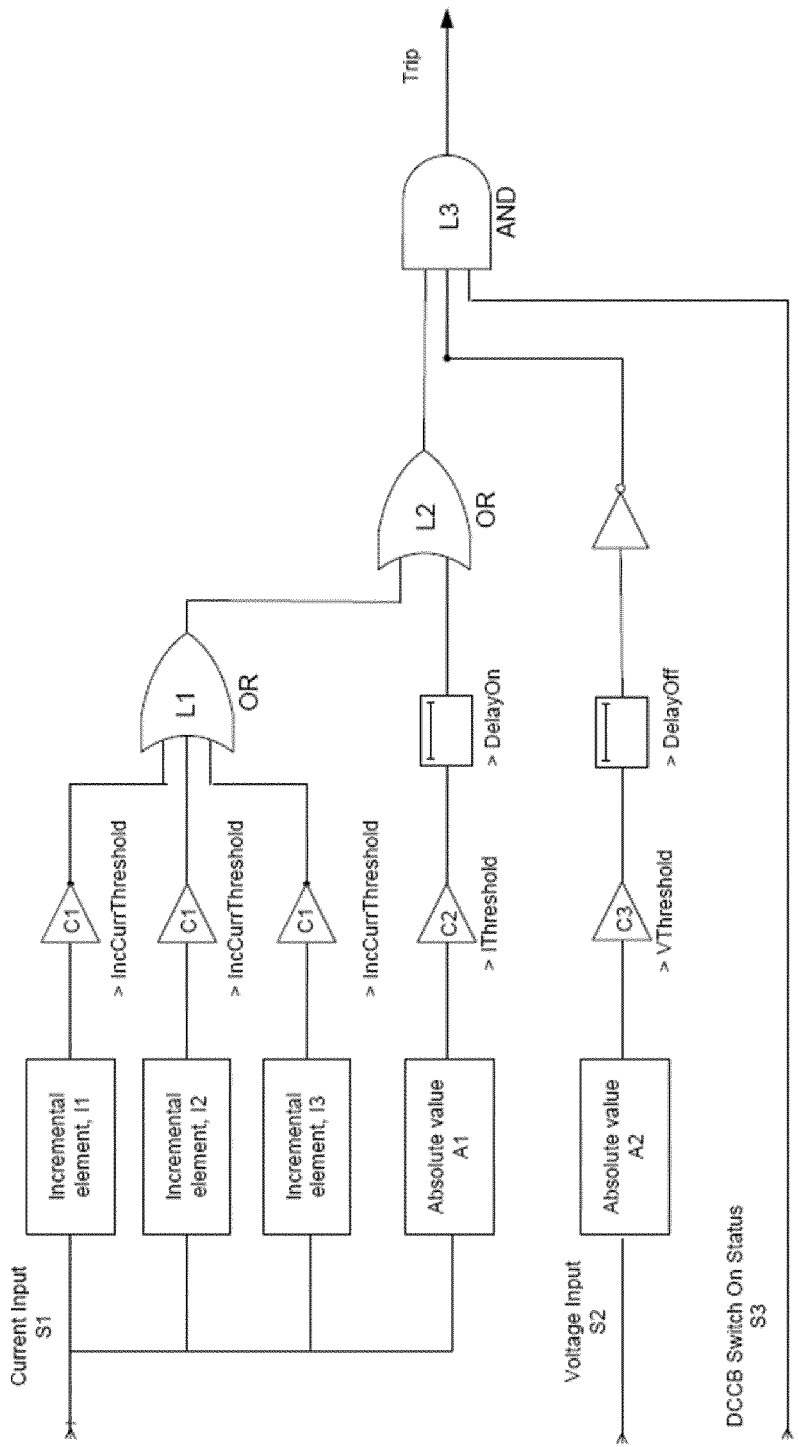
Figure 9:
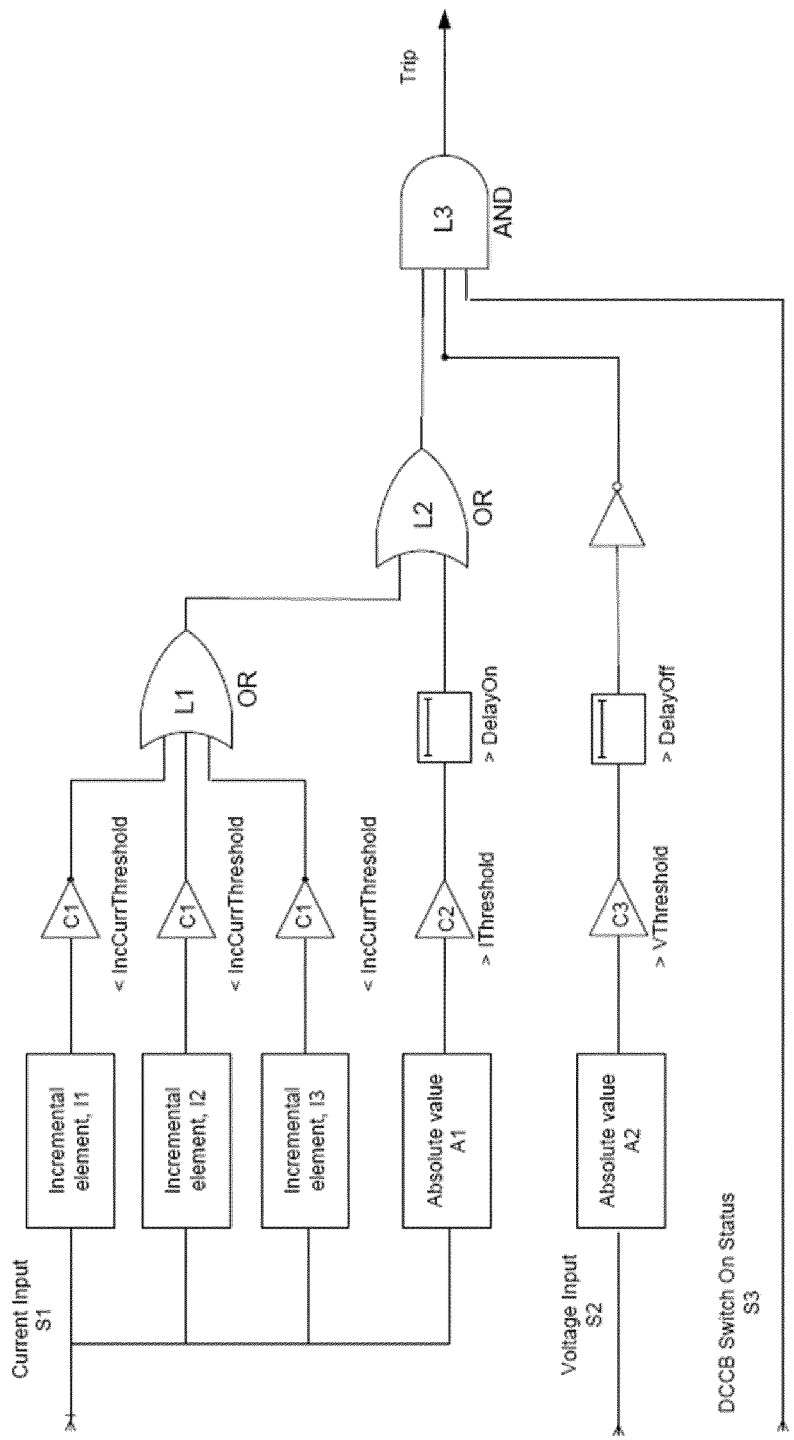
Figure 10:
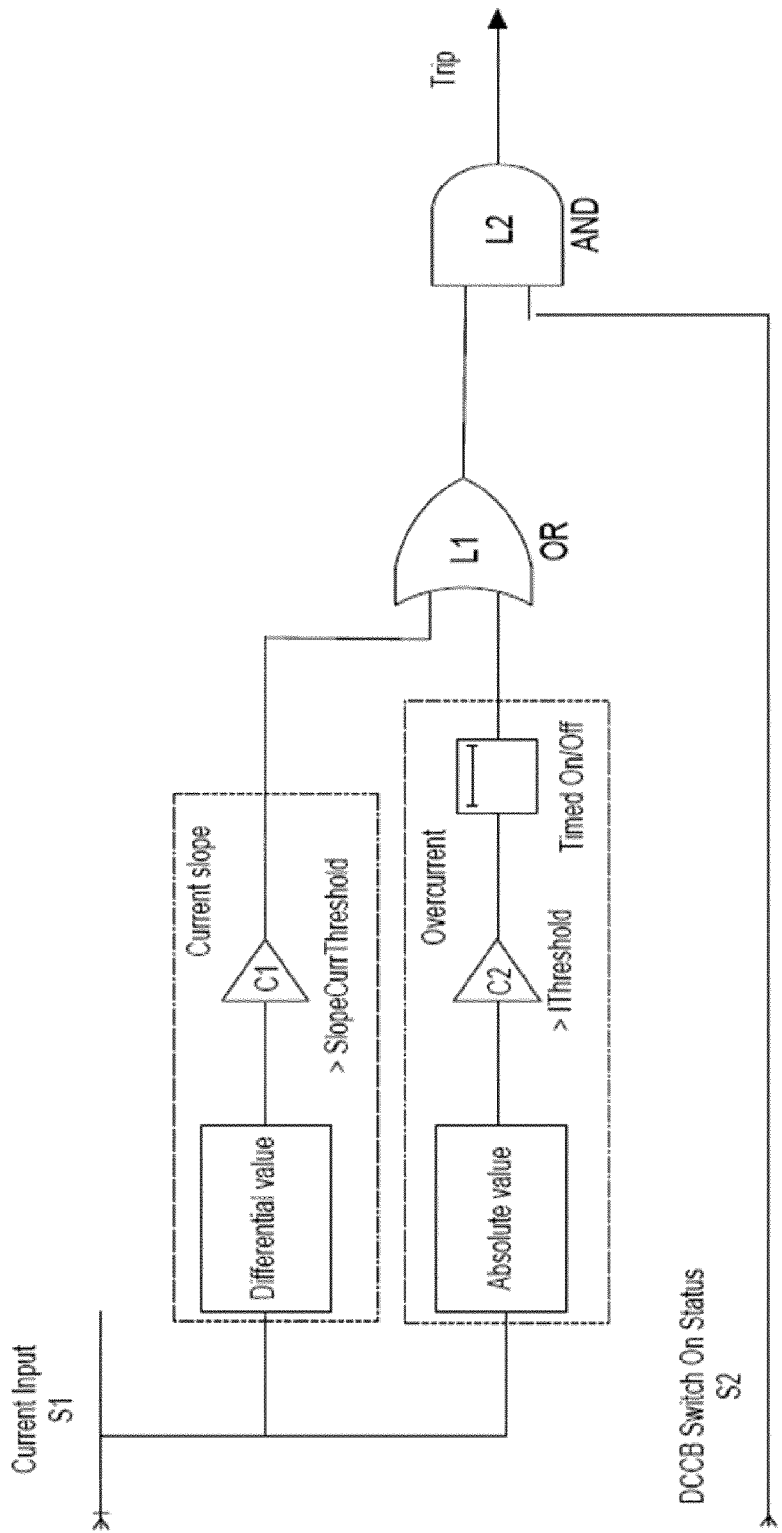

Referring now to FIGS. 8 and 10 and FIG. 9, respectively, there are shown logic diagrams of methods according to embodiments of the present invention that can be used to detect a permanent fault in the positive and negative pole of a protected unit, respectively, which protected unit includes a bipolar HVDC transmission line, comprising a positive pole line, a negative pole line, and a metallic return line connected to ground. However, although FIGS. 8, 9 and 10 refer to the particular example of where the protected unit includes a bipolar HVDC transmission line, the present invention is not limited to that particular example, which has also already been discussed in the foregoing. Rather, the example of where the protected unit includes a bipolar HVDC transmission line is taken as one non-limiting example for the purpose of describing principles of embodiments of the present invention.

The methods illustrated in FIGS. 8 and 10 and in FIG. 9, respectively, can be used to detect a permanent fault in the positive and negative pole of the transmission line, respectively, after switching a circuit breaker to energize the transmission line when it is open. The logic in the logic diagrams in FIGS. 8, 9 and 10 differ from the logic diagrams in FIGS. 5, 6 and 7, respectively, only in that instead of receiving an auto reclosing signal S3 (FIGS. 5 and 6) or auto reclosing signal S2 (FIG. 7) a DC circuit breaker (DCCB) Switch On Status signal S3 (FIGS. 8 and 9) or a DCCB Switch On Status signal S2 (FIG. 10) is received. The DCCB Switch On Status signal may be received from a DC circuit breaker after energization of the transmission line. The rest of the logic in the logic diagrams in FIGS. 8, 9 and 10 is similar to or the same as the logic in the logic diagrams in FIGS. 5, 6 and 7, respectively.

The DCCB Switch On Status signal S3 (FIGS. 8 and 9) or DCCB Switch On Status signal S2 (FIG. 10) can indicate a change in switch status of the circuit breaker from open to closed, or vice versa.

Figure 11:
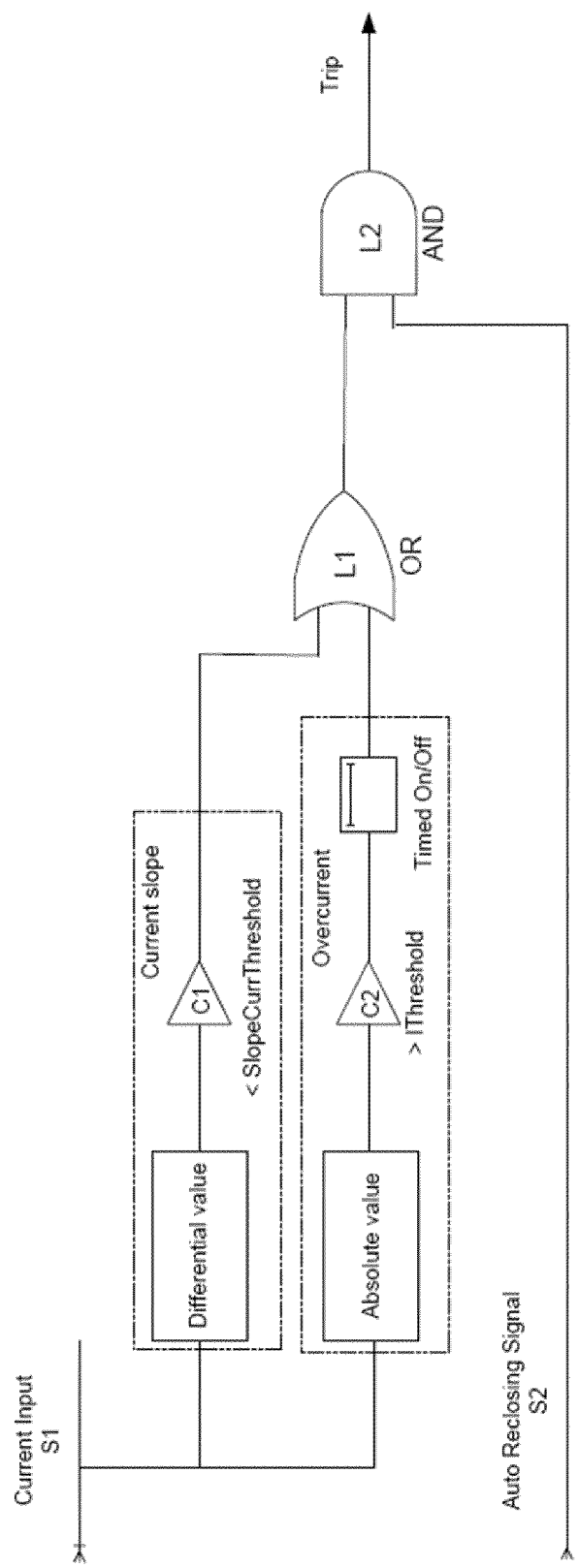
Figure 12:
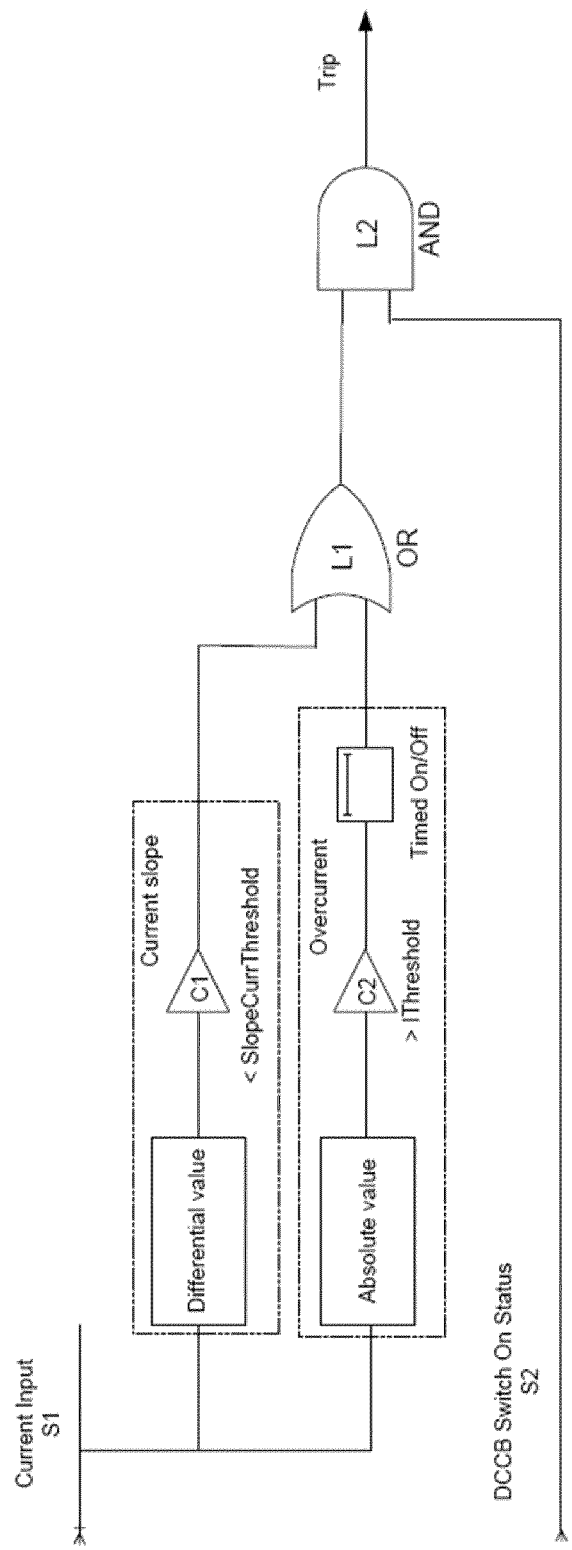

With further reference to FIGS. 7 and 10, it is to be noted that for the case of the negative pole of the transmission line, the differential current values input into module C1 will be negative following auto reclosing. FIGS. 11 and 12 show the slightly modified logic for the negative pole transmission line compared to the logic for positive pole transmission line illustrated in FIGS. 7 and 10, respectively. In FIGS. 11 and 12, the checks made in the C1 modules are based on a 'smaller than' threshold criteria, whereas in FIGS. 7 and 10, the checks made in the C1 modules are based on a 'larger than' threshold criteria.

In conclusion, there is disclosed a method for use in fault detection in a protected unit included in a power system. The method may facilitate detection of any fault in the protected unit after the protected unit has been connected to the at least a portion of the rest of the power system. A current in the at least one current path in the protected unit is sensed during a plurality of different time periods, thereby obtaining a plurality of sensed currents. The current in the at least one current path may be sensed at one end of the protected unit. Compliance of at least one of the sensed currents with a respective first current criteria is determined based on a first current threshold value. On a condition that there is determined that at least one of the sensed currents comply with the respective first current criteria, a signal may be generated indicating that there is a fault in the protected unit. On a condition that there is determined that none of the sensed currents comply with the respective first current criteria, a signal may be generated indicating that there is not a fault in the protected unit.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

The invention claimed is:

1. A method for use in fault detection in a protected unit included in a power system, the protected unit being adapted to convey power via at least one current path therein, wherein the protected unit is selectively disconnected from at least a portion of the rest of the power system and the protected unit is selectively connected to the at least a portion of the rest of the power system, the method being for facilitating detection of any fault in the protected unit after the protected unit has been connected to the at least a portion of the rest of the power system, the method comprising:
    sensing, with a sensor, a current in the at least one current path in the protected unit at one end thereof during a plurality of different time periods, thereby obtaining a plurality of sensed currents;
    determining, with a processing unit, compliance of at least one of the sensed currents with a respective first current criteria based on a first current threshold value, which first current criteria is a smaller than threshold criteria for a negative current and otherwise a larger than threshold criteria;
    on a condition that there is determined that at least one of the sensed currents comply with the respective first current criteria, generating a signal with the processing unit indicating that there is a fault in the protected unit; and
    on a condition that there is determined that none of the sensed currents comply with the respective first current criteria, generating a signal with the processing unit indicating that there is not a fault in the protected unit,
    wherein on a condition that at least one of the generated signal or signals indicate that there is a fault, the protected unit is selectively disconnected from the at least a portion of the rest of the power system,
    the sensed current in the at least one current path in the protected unit is sensed during at least three different respective time instants $t_1-t_0$, $t_2-t_0$, $t_3-t_0$, where $t_0$ is a time at which the protected unit is connected to the at least a portion of the rest of the power system after having been disconnected from the at least a portion of the rest of the power system, and $t_3 > t_2 > t_1 > t_0$, thereby obtaining the plurality of sensed currents $I(t_1-t_0)$, $I(t_2-t_0)$, and $I(t_3-t_0)$, and $t_1-t_0$ is determined by a time for a fault current in the at least one current path in the protected unit to reach a maximum discharging or inrush current subsequent to the protected unit having been connected to the at least a portion of the rest of the power system after having been disconnected from the at least a portion of the rest of the power system, on a condition that the fault occurs at a terminal to which the protected unit is connected.

2. The method according to claim 1, further comprising:
sensing a voltage of the at least one current path in the protected unit at one end thereof;
determining compliance of the sensed voltage with a voltage criteria based on a voltage threshold value;
on a condition that there is determined that the sensed voltage complies with the voltage criteria, generating a signal indicating that there is a fault in the protected unit.

3. The method according to claim 1, wherein $t_2-t_0$ is determined by a time for a fault current in the at least one current path in the protected unit to reach the first current threshold value on a condition that the fault occurs at a middle point of the at least one current path in the protected unit.

4. The method according to claim 1, wherein $t_3-t_0$ is determined by a time for a fault current in the at least one current path in the protected unit to reach the first current threshold value on a condition that the fault occurs at an end point of the at least one current path in the protected unit.

5. The method according to claim 1, further comprising:
determining an absolute value of at least one of the sensed currents;
determining compliance of the absolute value with a second current criteria based on a second current threshold value; and
on a condition that there is determined that the absolute value complies with the second current criteria, generating a signal indicating that there is a fault in the protected unit.

6. The method according to claim 5, wherein the signal indicating that there is a fault in the protected unit is generated if the absolute value exceeds the second current threshold value.

7. The method according to claim 1, further comprising:
on a condition that at least one of the generated signal or signals indicates that there is a fault in the protected unit, generating a first derived signal indicating that there is a fault in the protected unit; and
on a condition that none of the generated signal or signals indicate that there is a fault in the protected unit, generating a first derived signal indicating that there is not a fault in the protected unit.

8. The method according to claim 7, further comprising:
sensing a voltage of the at least one current path in the protected unit at one end thereof;
determining compliance of the sensed voltage with a voltage criteria based on a voltage threshold value;
on a condition that there is determined that the sensed voltage complies with the voltage criteria, generating a signal indicating that there is a fault in the protected unit; and
on a condition that both of said generated signal and the first derived signal indicate that there is a fault in the protected unit, generating a second derived signal indicating that there is a fault in the protected unit.

9. The method according to claim 1, wherein a current in the at least one current path in the protected unit is sensed continuously during a time window;
wherein determining compliance of at least one of the sensed currents with a respective first current criteria based on a first current threshold value comprises:
determining at least one quotient of a difference between currents $I(t>t_0)$ and $I(t_0)$, where t denotes time, and a difference between t and $t_0$; and
comparing the determined at least one quotient during the time window with a current slope threshold value, the current slope threshold value constituting the first current threshold value.

10. The method according to claim 9, wherein the time window is determined by a time for a fault current in the at least one current path in the protected unit to reach the first current threshold value on a condition that the fault occurs at an end point of the at least one current path in the protected unit.

11. A fault detection device for detection of a fault in a protected unit included in a power system, the protected unit being adapted to convey power via at least one current path therein, wherein the protected unit is selectively disconnected from at least a portion of the rest of the power system and the protected unit is selectively connected to the at least a portion of the rest of the power system, wherein the fault detection device is adapted to facilitate detection of any fault in the protected unit after the protected unit has been connected to the at least a portion of the rest of the power system, the fault detection device comprising:
a current sensor unit adapted to sense a current in the at least one current path in the protected unit at one end thereof during a plurality of different time periods, thereby obtaining a plurality of sensed currents;
a processing unit coupled to the current sensor unit and adapted to:
determine compliance of at least one of the sensed currents with a respective first current criteria based on a first current threshold value, which first current criteria is a smaller than threshold criteria for a negative current and otherwise larger than threshold criteria;
on a condition that there is determined that at least one of the sensed currents comply with the respective first current criteria, generate a signal indicating that there is a fault in the protected unit; and
on a condition that there is determined that none of the sensed currents comply with the respective first current criteria, generate a signal indicating that there is not a fault in the protected unit,
wherein on a condition that at least one of the generated signal or signals indicate that there is a fault, the protected unit is selectively disconnected from the at least a portion of the rest of the power system,
the sensed current in the at least one current path in the protected unit is sensed during at least three different respective time instants $t_1-t_0$, $t_2-t_0$, $t_3-t_0$, where $t_0$ is a time at which the protected unit is connected to the at least a portion of the rest of the power system after having been disconnected from the at least a portion of the rest of the power system, and $t_3 > t_2 > t_1 > t_0$, thereby obtaining the plurality of at least three sensed currents $I(t_1-t_0)$, $I(t_2-t_0)$, and $I(t_3-t_0)$, and $t_1-t_0$ is determined by a time for a fault current in the at least one current path in the protected unit to reach a maximum discharging or inrush current subsequent to the protected unit having been connected to the at least a portion of the rest of the power system after having been disconnected from the at least a portion of the rest of the power system, on a condition that the fault occurs at a terminal to which the protected unit is connected.

12. The fault detection device according to claim 11, wherein the processing unit is further adapted to:
determine the absolute value of at least one of the sensed currents;
determine compliance of the absolute value with a second current criteria based on a second current threshold value; and
on a condition that there is determined that absolute value complies with the second current criteria, generate a signal indicating that there is a fault in the protected unit.

13. The fault detection device according to claim 11, further comprising:
a voltage sensor unit adapted to sense a voltage of the at least one current path in the protected unit at one end thereof;
wherein the voltage sensor unit is coupled to the processing unit; and
wherein the processing unit is further adapted to:
determine compliance of the sensed voltage with a voltage criteria based on a voltage threshold value; and
on a condition that there is determined that the sensed voltage complies with the voltage criteria, generate a signal indicating that there is a fault in the protected unit.

14. A power system including:
a protected unit adapted to convey power via at least one current path therein, wherein the protected unit is selectively disconnected from at least a portion of the rest of the power system and the protected unit is selectively connected to the at least a portion of the rest of the power system; and
a fault detection device according to claim 11 adapted to facilitate detection of any fault in the protected unit after the protected unit has been connected to the at least a portion of the rest of the power system.

15. The power system according to claim 14, further including:
at least one DC circuit breaker adapted to selectively disconnect the protected unit from the at least a portion of the rest of the power system upon receipt of a disconnection signal and selectively connect the protected unit to the at least a portion of the rest of the power system upon receipt of a connection signal;
wherein the fault detection device is communicatively coupled to the at least one DC circuit breaker; and
wherein the processing unit of the fault detection device is adapted to, on a condition that at least one of the generated signals indicate that there is a fault in the protected unit, generate a disconnection signal and transmit the disconnection signal to the at least one DC circuit breaker, whereby the protected unit becomes disconnected from the at least a portion of the rest of the power system.

16. The power system according to claim 14, wherein the power system comprises a High Voltage Direct Current, HVDC, power transmission system.

17. The power system according to claim 14, wherein the protected unit comprises a power transmission line.

18. The power system according to claim 17, wherein the power transmission line comprises a direct current, DC, power transmission line.

19. The power system according to claim 17, wherein the power transmission line comprises an overhead line.

20. A computer program product adapted to be executed in a processing unit of a fault detection device in a power system, the computer program product comprising non-transitory computer-readable means carrying computer program code, the power system including a protected unit that is selectively isolated from at least a portion of the rest of the power system and the protected unit is selectively connected to the at least a portion of the rest of the power system after having been isolated from the at least a portion of the rest of the power system, wherein the fault detection device is adapted to facilitate detection of any fault in the protected unit after the protected unit has been connected to the at least a portion of the rest of the power system after having been isolated from the at least a portion of the rest of the power system, the fault detection device comprising a current sensor unit coupled to the processing unit and adapted to sense a current in the at least one current path in the protected unit at one end thereof at least once, the computer program code being configured to, when executed in the processing unit of the fault detection device:
cause the current sensor unit to sense a current in the at least one current path in the protected unit at one end thereof during a plurality of different time periods, thereby obtaining a plurality of sensed currents;
determine compliance of at least one of the sensed currents with a respective first current criteria based on a first current threshold value, which first current criteria is a smaller than threshold criteria for a negative current and otherwise a larger than threshold criteria;
on a condition that there is determined that at least one of the sensed currents comply with the respective first current criteria, generate a signal indicating that there is a fault in the protected unit; and
on a condition that there is determined that none of the sensed currents comply with the respective first current criteria, generate a signal indicating that there is not a fault in the protected unit,
wherein on a condition that at least one of the generated signal or signals indicate that there is a fault, the protected unit is selectively disconnected from the at least a portion of the rest of the power system,
the sensed current in the at least one current path in the protected unit is sensed during at least three different respective time instants $t_1-t_0$, $t_2-t_0$, $t_3-t_0$, where $t_0$ is a time at which the protected unit is connected to the at least a portion of the rest of the power system after having been disconnected from the at least a portion of the rest of the power system, and $t_3>t_2>t_1>t_0$, thereby obtaining the plurality of sensed currents $I(t_1-t_0)$, $I(t_2-t_0)$, and $I(t_3-t_0)$, and
$t_1-t_0$ is determined by a time for a fault current in the at least one current path in the protected unit to reach a maximum discharging or inrush current subsequent to the protected unit having been connected to the at least a portion of the rest of the power system after having been disconnected from the at least a portion of the rest of the power system, on a condition that the fault occurs at a terminal to which the protected unit is connected.

* * * * *